United States Patent

Takahashi et al.

[11] Patent Number: 5,982,239
[45] Date of Patent: Nov. 9, 1999

[54] PHASE LOCKED LOOP CIRCUIT AND A PICTURE REPRODUCING DEVICE

[75] Inventors: Fumihiro Takahashi, Kodaira; Shikiko Nachi, Higashiyamato; Norihisa Yamamoto, Kodaira; Makoto Furihata, Maebashi, all of Japan

[73] Assignees: Hitachi, Ltd.; Microcomputer System Ltd., both of Tokyo, Japan

[21] Appl. No.: 09/011,225

[22] PCT Filed: Aug. 5, 1996

[86] PCT No.: PCT/JP96/02190

§ 371 Date: Feb. 9, 1998

§ 102(e) Date: Feb. 9, 1998

[87] PCT Pub. No.: WO97/07594

PCT Pub. Date: Feb. 27, 1997

[30] Foreign Application Priority Data

Aug. 14, 1995 [JP] Japan ..................... 7-207115

[51] Int. Cl.[6] .................... H03L 7/08; H03L 7/087
[52] U.S. Cl. ................... 331/11; 331/1 A; 331/14; 331/20; 331/25; 327/156; 327/159; 360/51
[58] Field of Search .................... 331/1 A, 11, 14, 331/17, 18, 20, 25, DIG. 2; 327/156–159; 360/51

[56] References Cited

U.S. PATENT DOCUMENTS

| 4,069,462 | 1/1978 | Dunn ............................... 331/11 |
| 4,365,211 | 12/1982 | Lee ................................. 331/11 |
| 4,511,859 | 4/1985 | Dombrowski ...................... 331/11 |
| 4,542,351 | 9/1985 | Okada .............................. 331/11 |
| 4,593,254 | 6/1986 | Coburn ............................ 331/1 A |
| 4,596,963 | 6/1986 | Lawton et al. ..................... 331/14 |
| 4,688,205 | 8/1987 | Abiko .............................. 369/59 |
| 4,943,788 | 7/1990 | Laws et al. ....................... 331/11 |
| 5,157,355 | 10/1992 | Shikakura et al. ................. 331/11 |
| 5,663,688 | 9/1997 | Delmas et al. .................... 331/14 |

FOREIGN PATENT DOCUMENTS

| 51-99457 | 9/1976 | Japan . |
| 63-125471 | 8/1988 | Japan . |
| 1-165226 | 6/1989 | Japan . |
| 1-223823 | 9/1989 | Japan . |
| 2-70124 | 3/1990 | Japan . |
| 2-149018 | 6/1990 | Japan . |
| 2-231892 | 9/1990 | Japan . |
| 5-41039 | 2/1993 | Japan . |
| 5-206845 | 8/1993 | Japan . |

*Primary Examiner*—David Mis
*Attorney, Agent, or Firm*—Fay, Sharpe, Beall, Fagan, Minnich & McKee

[57] ABSTRACT

A first phase comparator 22 of digital type and a second phase comparator 32 of sampling type are provided. Near a lock phase, an output current Iout2 is fed from the second phase comparator 32 to a voltage-controlled oscillator 14 through a change-over switch 40. In other phases, an output current Iout1 is fed thereto from the first phase comparator 22. When a reference signal fs is missing, a complementing circuit 50 complements a pulse to at least the reference signal fs input to the first phase comparator 22. A noise detecting/removing circuit 60 detects and removes noise from the reference signals fs, permits the reference signals fs to be fed to the first and second phase comparators 22 and 23, and halts the operations of the two phase comparators 22 and 32 for only a predetermined period of time after the noise has been detected. Therefore, the PLL circuit stably operates and characters are clearly displayed on a screen even when the noise is contained in the horizontal synchronizing signals of the video signals or even when the signals are missing.

12 Claims, 20 Drawing Sheets

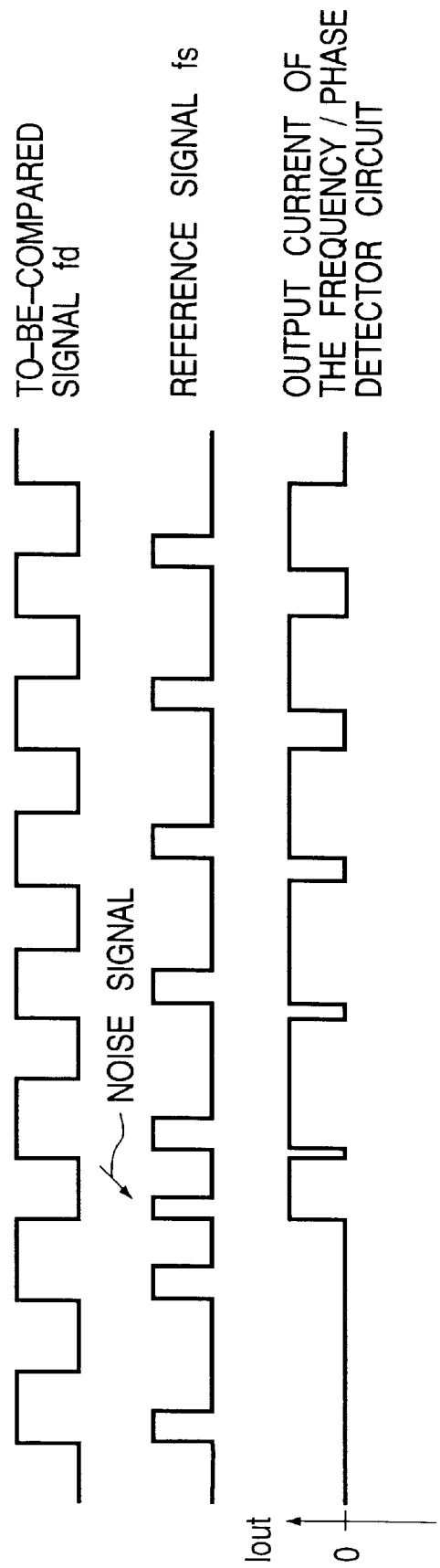

PHASE LOCKED LOOP CIRCUIT AND A PICTURE REPRODUCING DEVICE

BACKGROUND OF THE INVENTION

1. Field of the Invention

The present invention relates to a technology that can be particularly effectively adapted to an integrated circuit device and to a PLL circuit. More particularly, the invention relates to a technology that can be effectively utilized for a device for generating clock signals for controlling the character display positions at the time of adding character data to an image such as of TV, and or can be effectively utilized for a device for generating clock signals necessary for the A/D (analog-to-digital) conversion of video signals.

2. Prior Art

There has been known a PLL (phase-locked loop) circuit which is a phase-synchronizing circuit that follows up the phase of an input signal (reference signal) that serves as a reference, comprising, as shown in FIG. 26, a phase comparator 12 which compares a reference signal fs input through a reference signal input terminal 11 with a signal (hereinafter referred to as to-be-compared signal) obtained by dividing an oscillation output signal fv of a voltage-controlled oscillator (VCO) 14 by a frequency divider 15, and generates a phase error signal corresponding to the difference in phase between the two signals fs and fd, a low-pass filter 13 which decreases high-frequency components of the phase error signal thereby to obtain an error signal voltage Vd, a voltage-controlled oscillator 14 which, upon receiving the error signal voltage Vd, varies the frequency of the oscillation output signals fv so that the frequency difference from the reference signal fs decreases, and a frequency divider 15, the signals divided by the frequency divider 15 being fed back to the phase comparator 12. In FIG. 26, reference numeral 16 denotes an output terminal of the voltage-controlled oscillator 14.

The phase comparator 12 may often be of the digital type called phase/frequency comparator (frequency/phase detector circuit) in which the polarity of a phase error signal of when the frequency is deviated and the polarity of a phase error signal after the frequency is brought into agreement continuously operate.

As the PLL circuits using two phase comparators, furthermore, there have been known a circuit which uses a memory-type phase comparator at the time of establishing synchronism such as of communications and changes it to a zero-memory phase comparator near the lock-in (Japanese Patent Publication No. 70124/1990), a circuit which effects the sweeping with a digital phase/frequency comparator from the initial state to the pull-in range and, then, changes it to an analog phase comparator (Japanese Patent Publication No. 149018/1990), and a circuit which adds up the output of a first phase comparator and the output of a second phase comparator supplied with an inverted input signal (Japanese Patent Laid-Open No. 165226/1989).

It was, however, found out by the present inventors that the PLL circuits using the digital phase comparator shown in FIG. 26 involve a problem described below.

That is, in a PLL circuit using a conventional digital phase comparator, there exists a blind region near the lock phase where the phase difference becomes 0° as shown in FIG. 27 due to the frequency characteristics of phase error signals of an output circuit. Therefore, a very small phase error signal is not actually output that should be output near the lock phase. Accordingly, the oscillation output signal fv of the voltage-controlled oscillator 14 includes jitter and lose stability.

Furthermore, the digital phase comparator detects the phase difference between the pulse edges of the two signals. Therefore, when the synchronizing signals are input as reference signals fs to the phase comparator 12 creating a state that a pulse, that should be input, is missing and is not input like during a special reproduction of a VTR (video tape recorder) (this state will be hereinafter referred to as loss of signal), incorrect phase error signals (output current Iout of FIG. 28) are continuously output as shown in FIG. 28 until the phase of the to-be-compared signal fd is brought into agreement with the phase of the reference signal fs. Noise is often superposed on the synchronizing signals during the special reproduction of VTR. Even when the synchronizing signals on which the noise is superposed are used as reference signals fs for the phase comparator 12, incorrect phase error signals (output current Iout of FIG. 29) are continuously output as shown in FIG. 29 until the phase of the to-be-compared signal fd is brought into agreement with the phase of the reference signal fs. The loss of signal and the noise cause disturbance in the operation of the voltage-controlled oscillator 14 that generates clock signals for controlling the character display positions at the time of adding character data to an image, permitting the displayed characters to oscillate.

The present invention has been made in view of the above-mentioned circumstances, and an object thereof is to provide a PLL circuit that is capable of stably producing output signals without affected by jitter caused by a blind region of the phase comparator.

Another object of the present invention is to provide a PLL circuit which stably operates without affected by the missing of signal or noise.

The above and other objects as well as novel features of the present invention will become obvious from the description of the specification and the accompanying drawings.

SUMMARY OF THE INVENTION

Representatives of the invention disclosed in the present application will be briefly described below.

That is, in the PLL circuit of the present invention, there are parallelly provided a first phase comparator of digital type for detecting time deviation between the pulse edges of the mutually corresponding phases of a reference signal and a to-be-compared signal, a second phase comparator of the type which effects the sampling in a predetermined period of from a positive pulse edge to a negative pulse edge of a predetermined phase of the reference signal, and two phase error signals are alternatively selected by a change-over switch so that a phase error signal is input from the second phase comparator to a voltage-controlled oscillator near the lock phase and a phase error signal is input thereto from the first phase comparator in other phases.

The change-over operation of the change-over switch may be effected by a control signal that is output in synchronism with the to-be-compared signal from a frequency divider in the PLL circuit.

When the reference signal is missing, furthermore, pulses are complemented by a complementing circuit at a predetermined timing and is input to the first phase comparator.

Furthermore, there is provided a circuit which detects and removes noise from the reference signals, and reference signals of periods lying within a predetermined range only are permitted to be input to the first phase comparator and to the second phase comparator. After the noise is detected, the operation of the first phase comparator and the second phase comparator are halted for only a predetermined period of time, for example, for three periods of the reference signals from which the noise has been removed.

In the PLL circuit of the present invention, furthermore, a clock signal is generated for controlling the positions where the character data that are added to video signals are displayed, in synchronism with a horizontal synchronizing signal of video signals in the image-reproducing device. Here, there are provided, on the same semiconductor chip, a logic integrated circuit for controlling the reproduction of image, a logic integrated circuit for controlling drive means for reproducing image, and a logic integrated circuit which generates clock signals for controlling the positions where the characters are displayed, and controls the addition of character data to the video signals based upon the clock signals.

According to the above-mentioned means, near the lock phase where the digital phase comparator is placed in the blind region, a phase error signal is input to the voltage-controlled oscillator from the second phase comparator of the sampling type. Therefore, the PLL circuit as a whole has no blind region, and the voltage-controlled oscillator produces signals more stably.

Even when the reference signal is missing, the missing signal is complemented by the complementing circuit. Therefore, the first phase comparator is prevented from erroneously operating, and the PLL circuit has improved stability and reliability.

Moreover, even when the noise is superposed on the reference signals, the noise is removed by the noise detecting/removing circuit, and both phase comparators stop operating. Accordingly, the phase comparators are prevented from erroneously operating, and the PLL circuit has improved stability and reliability.

BRIEF DESCRIPTION OF THE DRAWINGS

FIG. 29 is a timing chart of when noise is superposed in the conventional PLL circuit.

BEST MODE FOR CARRYING OUT THE INVENTION

The PLL circuit of a first embodiment according to the present invention will now be described with reference to FIGS. 1 to 7.

Figure 1:
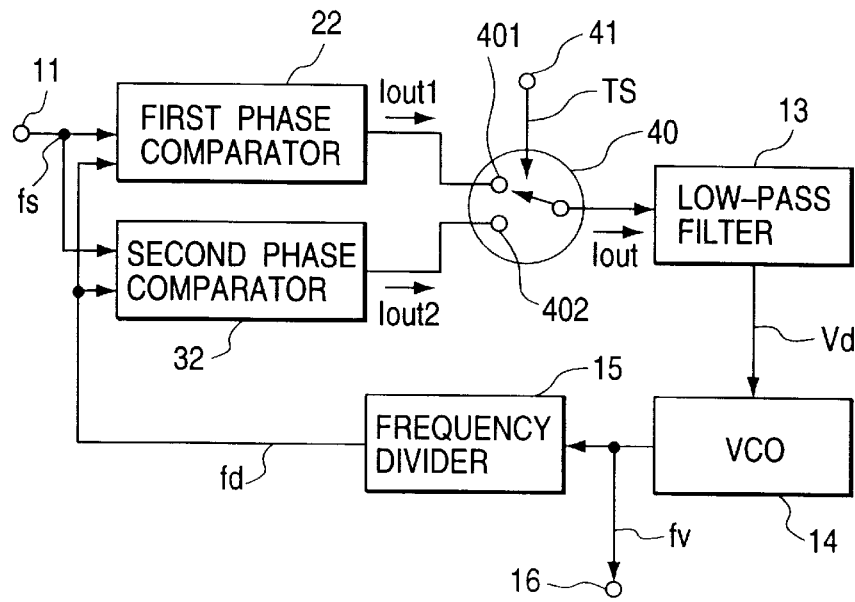
FIG. 1 is a block diagram illustrating the constitution of a PLL circuit of a first embodiment according to the present invention.

In the PLL circuit as shown in FIG. 1, output currents Iout1 and Iout2 based on phase error signals obtained by a first phase comparator 22 of digital type and a second phase comparator 32 of sampling type, are suitably changed over by a change-over switch 40 and are input as a resultant output current Iout to a low-pass filter 13. That is, the first phase comparator 22 and the second phase comparator 32 are time-divisionally operated by the change-over switch 40 so that both output currents Iout1 and Iout 2 are not simultaneously output to the low-pass filter 13. The change-over switch 40 performs the change-over operation upon receiving time-division control signals TS input to a time-division control signal input terminal 41 from an external timing controller (not shown).

The low-pass filter 13 decreases high-frequency components in the resultant output current Iout that is received to thereby obtain an error signal voltage Vd. In response to the error signal voltage Vd, a voltage-controlled oscillator (VCO) 14 adjusts the frequency of its own oscillation output signals fv and outputs them to the frequency divider 15 and to the output terminal 16, so that the difference of frequency from the reference signals fs input to the first and second phase comparators 22 and 32 from the reference signal input terminal 11 decreases and synchronism is accomplished.

The frequency divider 15 divides the frequency of oscillation output signals fv into the same frequency as the reference signals fs to form to-be-compared signals fd, and outputs them to the first and second phase comparators 22 and 32. These two phase comparators 22 and 32 compare the phases of the to-be-compared signals fd and of the reference signals fs, and output the currents Iout1 and Iout2, respectively.

In this embodiment, the oscillation output signals fv output from the voltage-controlled oscillator 14 are oscillating at a frequency N (N is an integer of 2 or more) times of the frequency of the reference signals fs. Therefore, the frequency divider 15 divides the frequency of the oscillation output signals fs into one-Nth (1/N). The frequency divider 15 is not required when the oscillation frequency of the voltage-controlled oscillator 14 is the same as the frequency of the reference signals fs.

In the PLL circuit of this embodiment, horizontal synchronizing signals of video signals such as of TV or the like are used as reference signals fs, and clock signals for controlling the character display positions at the time of adding character data to the image and clock signals for subjecting the video signals to A/D conversion are generated by the voltage-controlled oscillator 14.

Figure 2:
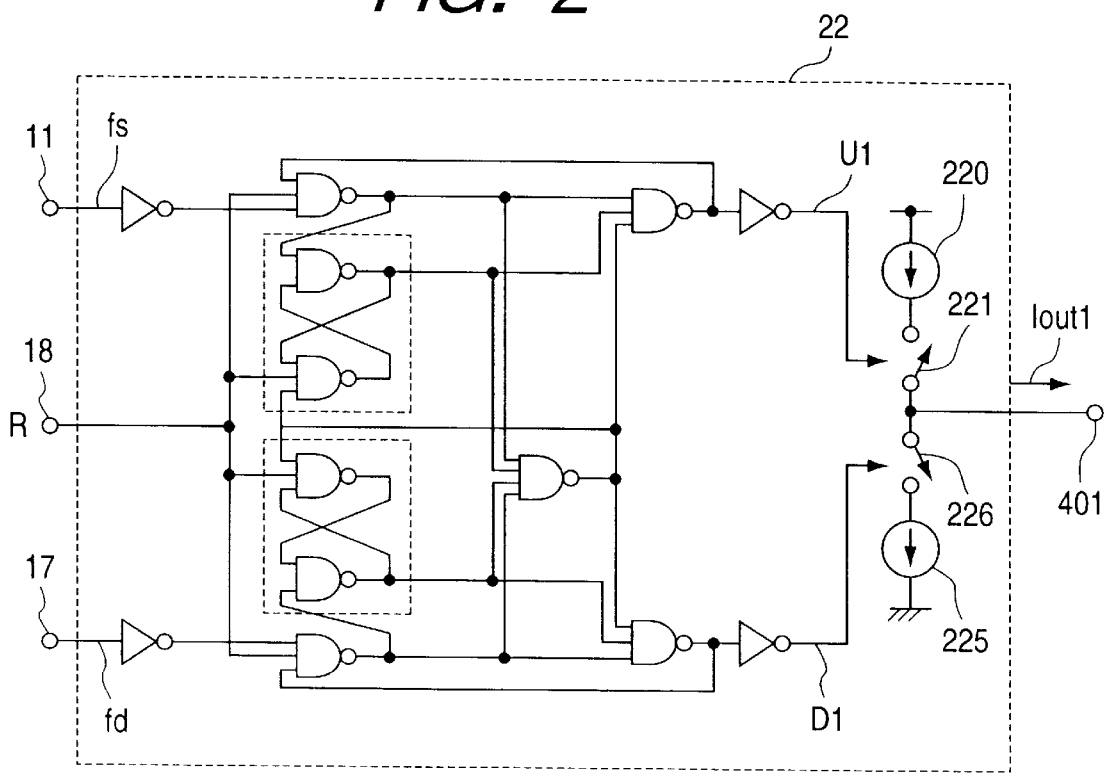
FIG. 2 is a diagram of a logic circuit illustrating a first phase comparator of the PLL circuit.

FIG. 2 illustrates a first phase comparator 22. This phase comparator 22 is a phase/frequency comparator constituted of a combination of a latch comprising, for example, a NAND gate and an inverter. The phase comparator 22 compares the corresponding rising pulse edges of the reference signals fs input through the reference signal input terminal 11 and of the to-be-compared signals fd input from the frequency divider 15 through an input terminal 17. In FIG. 2, reference numeral 18 denotes a reset terminal of the aphase comparator 22.

Figure 3:
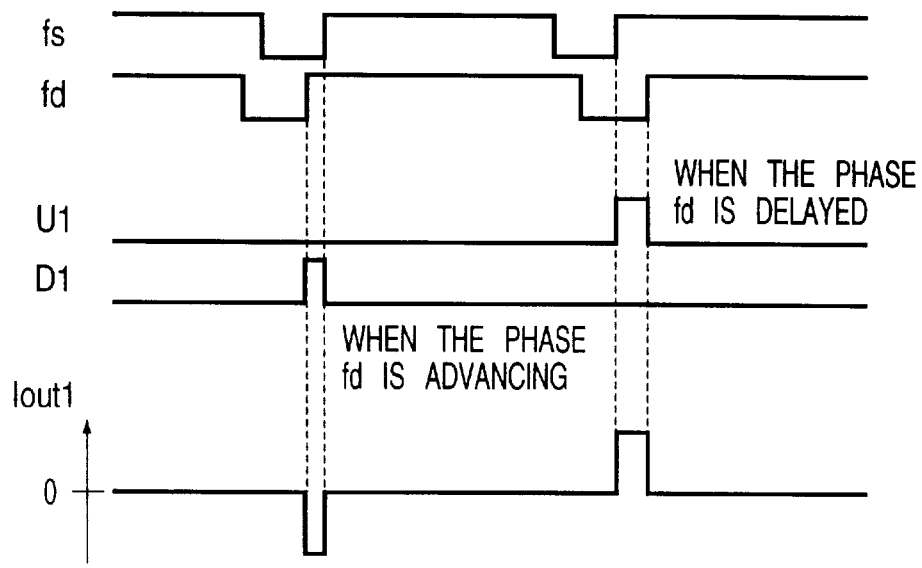
FIG. 3 is a timing chart for explaining the principle of the operation of the first phase comparator.

As a result of comparing the phases, when, for example, the phase of the to-be-compared signal fd lags behind the reference signal fs as shown in FIG. 3, a signal (phase error signal) corresponding to the phase difference is output to an up-output U1 of the phase comparator 22. When the phase of the to-be-compared signal fd is in advance, on the other hand, of a signal (phase error signal) corresponding to the phase difference is output to a down output D1 in the phase comparator 22. When the phase error signal is output to the up output U1, a switching circuit 221 in the phase comparator 22 is turned on, whereby a positive (+) current source 220 is connected to one input terminal 401 of the change-over switch 40, and a positive output current Iout1 flows toward the input terminal 401. When the phase error signal is output to the down output D1, a switching circuit 226 in the phase comparator 22 is turned on, whereby a negative (−) current source 225 is connected to the input terminal 401 of the change-over switch 40, and a negative output current Iout 1 flows toward a grounding point from the input terminal 401.

Figure 4:
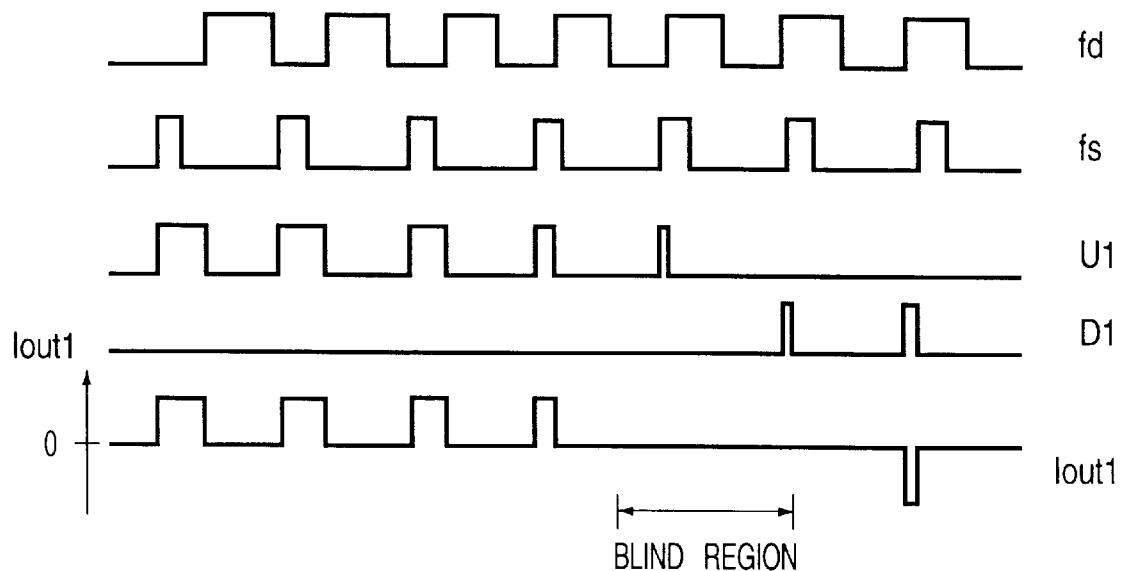
FIG. 4 is a timing chart illustrating the operation timings of the first phase comparator.

As shown in FIG. 4, the phase comparator 22 has a blind region in which it does not output the current Iout1 for a very small phase error signal (fifth pulse from the left in U1 of FIG. 4, and first pulse from the left in D1) that is output to the output U1 or D1 near the lock phase.

Figure 5:
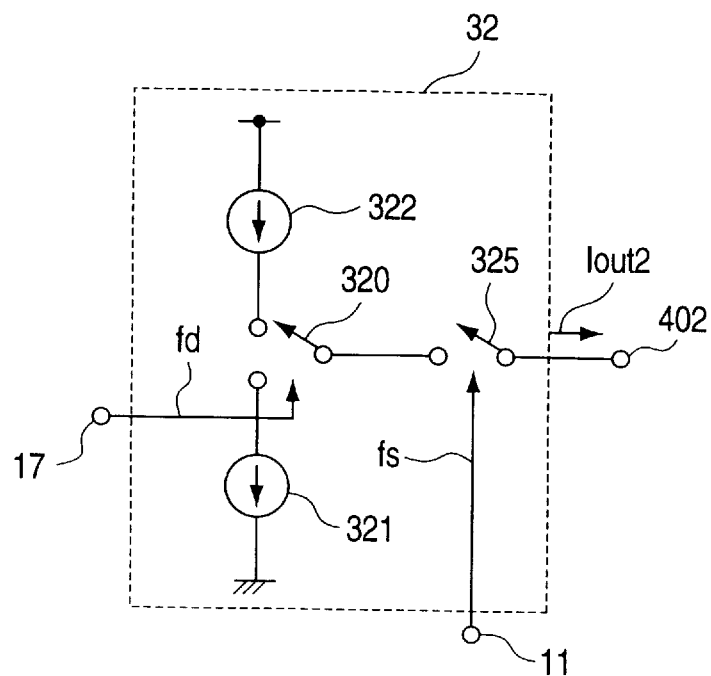
FIG. 5 is a diagram of a logic circuit of a second phase comparator of the PLL circuit.
Figure 6:
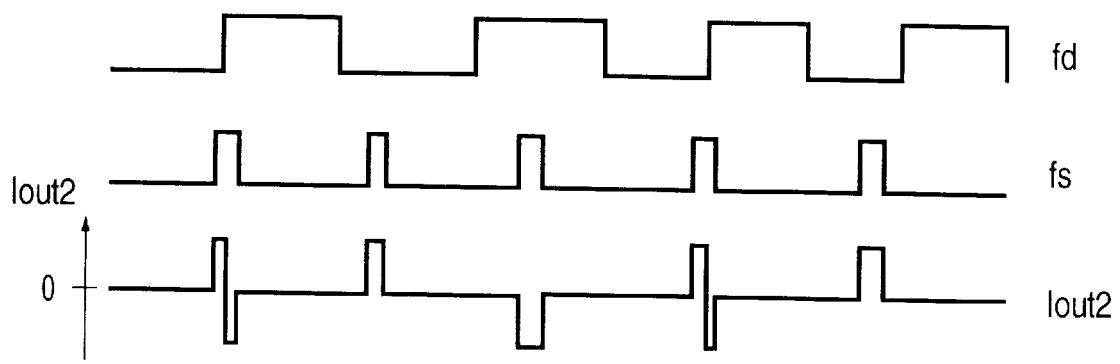
FIG. 6 is a timing chart for explaining the principle of the operation of the second phase comparator.

FIG. 5 illustrates the second phase comparator 32. When the to-be-compared signal fd input from the frequency divider 15 through the input terminal 17 is at a high level, a switching circuit 320 in the phase comparator 32 selects a negative current source 321. When the to-be-compared signal fd is at a low level, the switching circuit 320 selects a positive current source 322. Due to a switching circuit 325 in the phase comparator 32 that is turned on/off by the reference signal fs input through the reference signal input terminal 11, a current selected by the switching circuit 320 is sampled for only a period in which the reference signal fs is at the high level. Therefore, a positive output current Iout 2 flows from the phase comparator 32 to the second input terminal 402 of the change-over switch 40 (see FIG. 1) when the reference signal fs is at the high level and the to-be-compared signal fd is at the low level as shown in FIG. 6, and a negative output current Iout2 flows when both the reference signal fs and the to-be-compared signal fd are at the high level.

Figure 7:
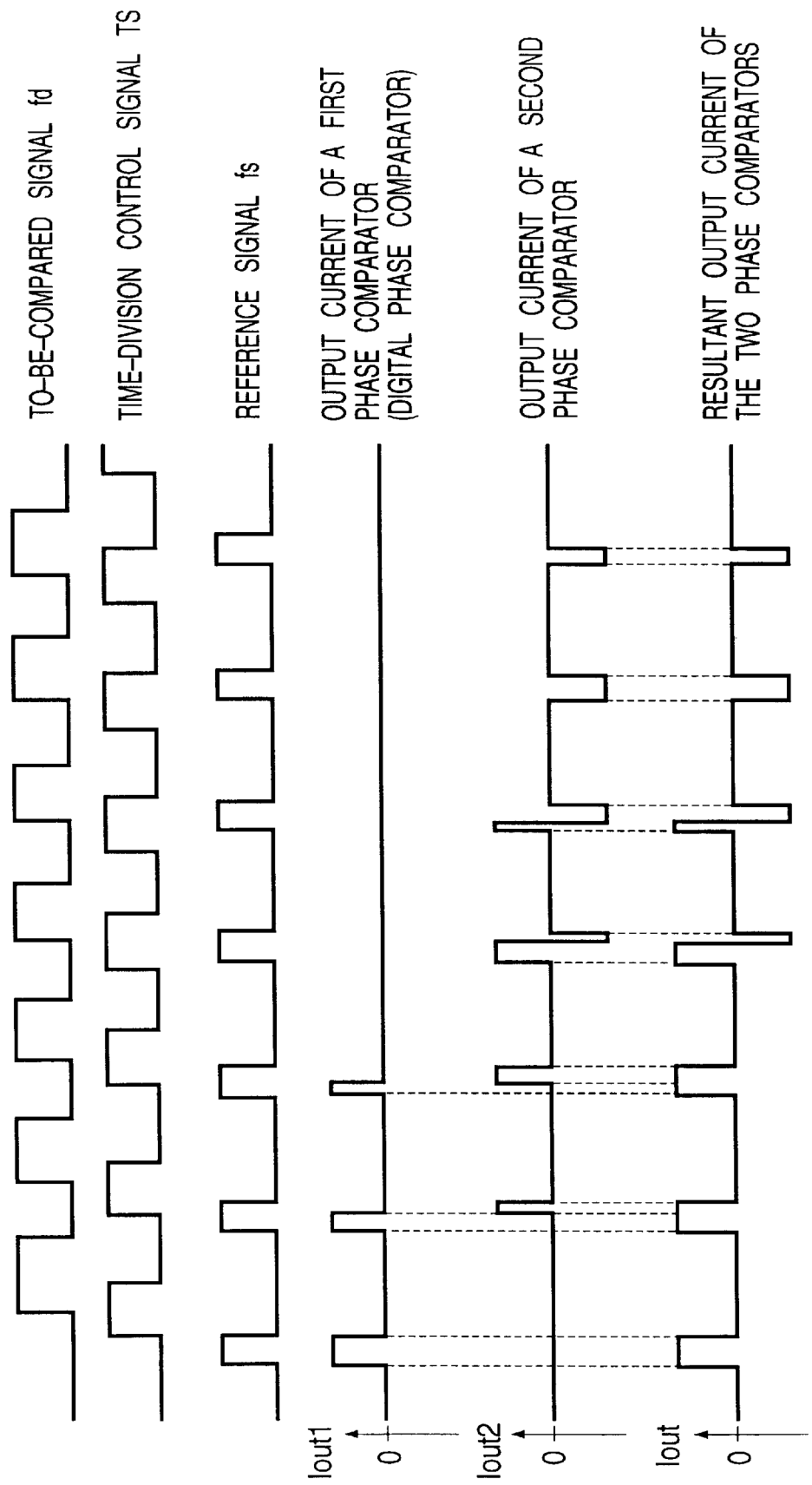
FIG. 7 is a timing chart illustrating the operation timings of the PLL circuit of the first embodiment.

FIG. 7 shows output timings of the output current Iout1 of the first phase comparator 22, output current Iout2 of the second phase comparator 32 and resultant output current Iout. As shown in FIG. 7, the time-division control signals TS for controlling the timing at which the change-over switch 40 is switched have a time width spanning before and after the rising (positive) pulse edge which is the lock phase of the to-be-compared signals fd. Therefore, the second phase comparator 32 outputs a current Iout2 near the lock phase where the first phase comparator 22 does not output the current Iout1 since it is in the blind region. Therefore, the resultant output current Iout is produced even near the lock phase. In other words, the first phase comparator 22 controls the phase in a state that the phase is greatly deviated from the frequency control, and the second phase comparator 32 controls the phase in a state that the deviation of the phase is small.

Accordingly, there is no blind region in the PLL circuit as a whole, whereby the voltage-controlled oscillator 14 operates stably, and the oscillation frequency of the oscillation output signals fv is stabilized.

Figure 8:
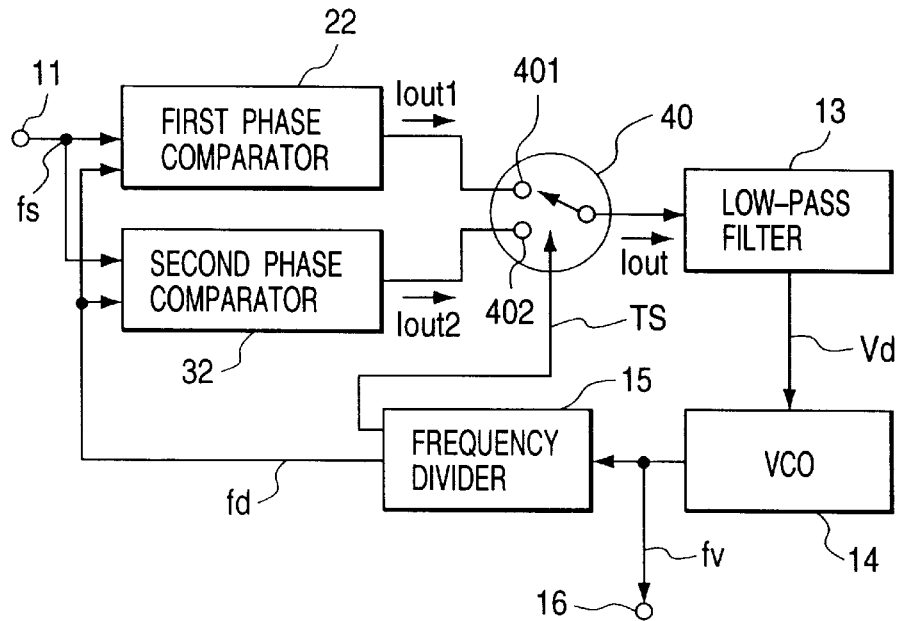
FIG. 8 is a block diagram illustrating the PLL circuit of a second embodiment according to the present invention.
Figure 9:
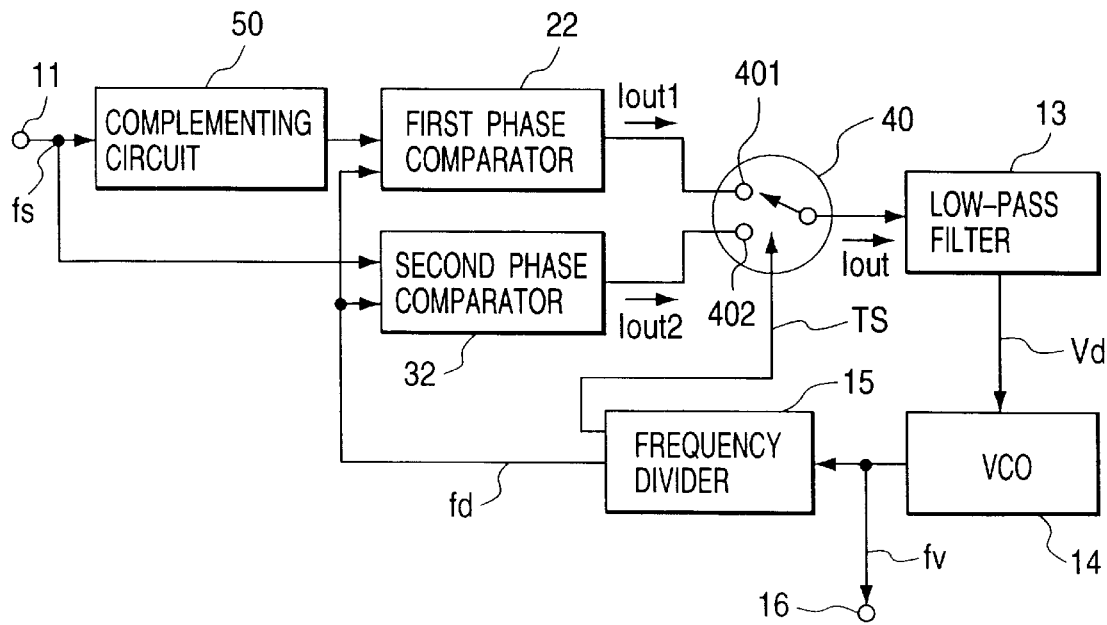
FIG. 9 is a block diagram illustrating the PLL circuit of a third embodiment according to the present invention.

FIG. 8 illustrates the PLL circuit of a second embodiment according to the present invention.

This PLL circuit is different from that of the above-mentioned first embodiment in that the time-division control signals TS are generated by the frequency divider 15 and are input to the change-over switch 40 as shown in FIG. 8. In the other respects, the constitution is the same as that of the above-mentioned first embodiment. Therefore, the same reference numerals are used and the description will not be repeated.

Though there is no particular limitation, the oscillation output signals fv are produced by the voltage-controlled oscillator 14 at a frequency eight times as high as that of the reference signals fs. The frequency of the oscillation output signals fv is divided by the frequency divider 15 into a one-eighth (⅛) frequency to obtain to-be-compared signals fd. The frequency divider 15 of this embodiment generates signals having a one-eighth duty ratio and outputs them as time-division control signals TS.

The PLL circuit of a third embodiment according to the present invention will be described with reference to FIGS. 9 to 12.

This PLL circuit is the same as the PLL circuit of the above-mentioned second embodiment but in which a complementing circuit 50 is provided before the first phase comparator 22 to complement missing reference signal fs, so that the reference signals fs are input to the first phase comparator 22 without signal missing. In other respects, the constitution is the same as that of the above-mentioned second embodiment. Therefore, the same reference numerals are used and the description will not be repeated.

Figure 10:
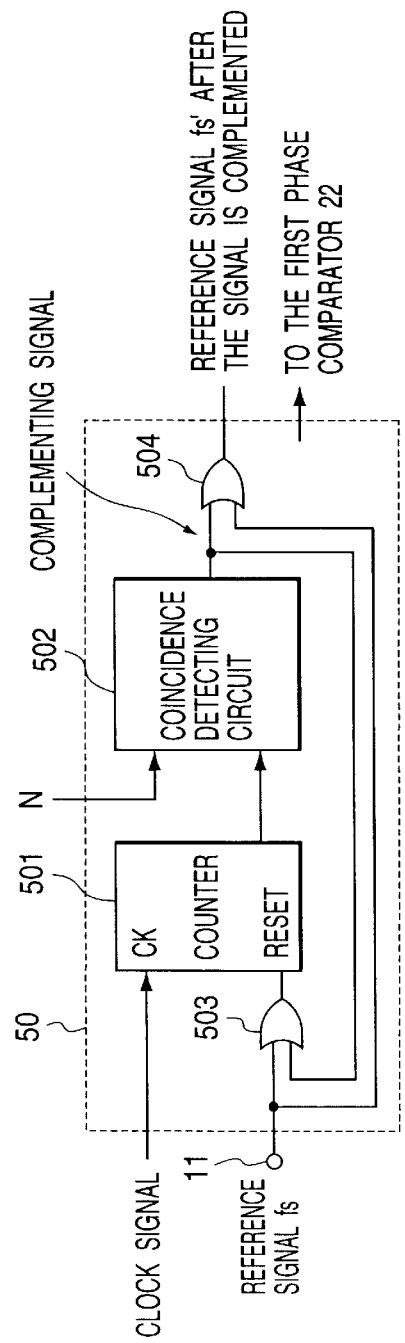
FIG. 10 is a block diagram illustrating a complementing circuit of the PLL circuit.
Figure 11:
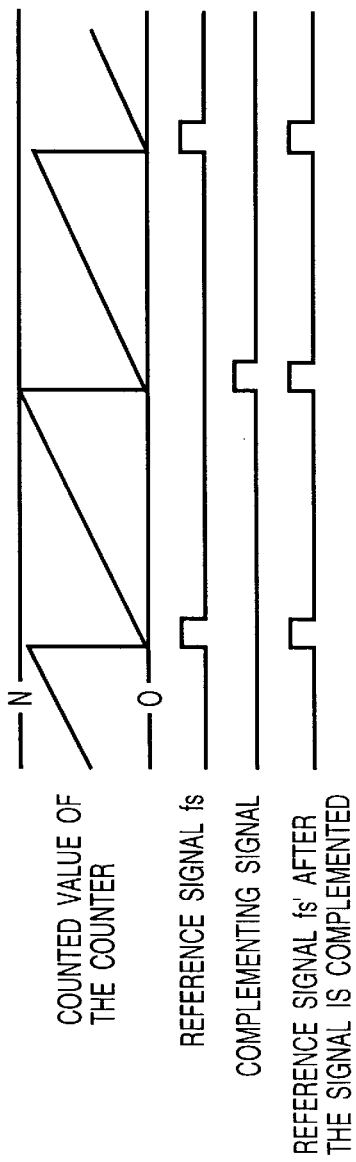
FIG. 11 is a timing chart illustrating the operation timings of the complementing circuit.

FIGS. 10 and 11 illustrate an example of the complementing circuit 50 and its operation timings. The complementing circuit 50 includes a counter 501 for counting the number of clock signals CK that serve as a reference, and a coincidence detecting circuit 502 which detects that the counted value of the counter 501 comes in agreement with a predetermined value N (which has been set in advance) corresponding to the original period of the reference signals and outputs a complementing signal. Therefore, the frequency of the reference clock signals CK is much higher than the frequency of the reference signals fs.

The complementing signal output from the coincidence detecting circuit 502 is input to an OR gate 504 that receives the reference signals fs at one input. Accordingly, the OR gate 504 outputs the complemented reference signals fs' to the first phase comparator 22.

A reset terminal of the counter 501 receives the output signal of an OR gate 503 that receives the reference signals and the complementing signal. When the complementing circuit 50 receives the reference signal fs or the complementing signal from the coincidence detecting circuit 502, the counter 501 is reset and counts again starting with "0".

Figure 12:
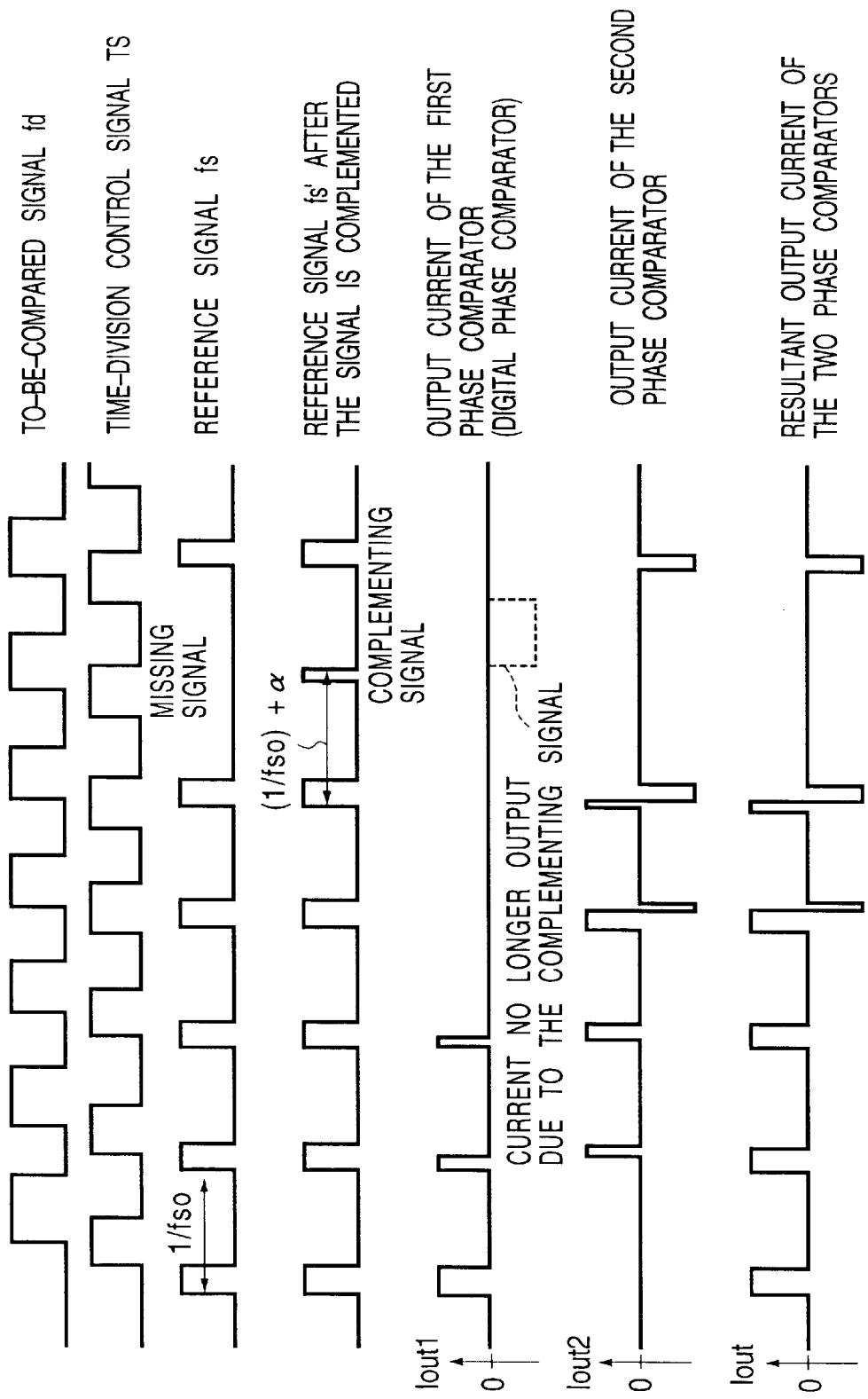
FIG. 12 is a timing chart illustrating the operation timings of the PLL circuit of the third embodiment.
Figure 13:
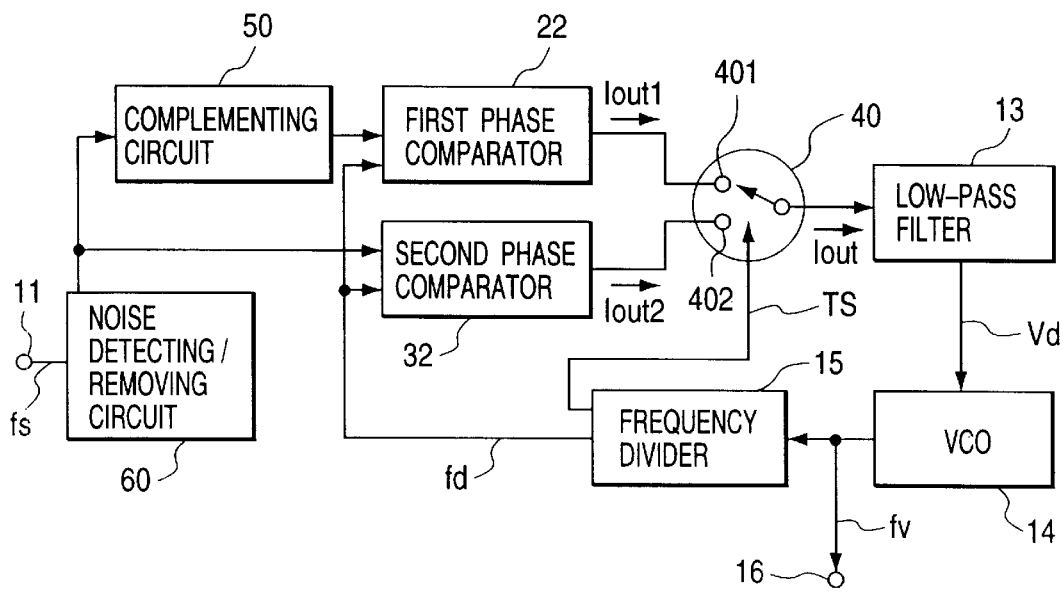
FIG. 13 is a block diagram illustrating the constitution of the PLL circuit of a fourth embodiment according to the present invention.

FIG. 12 illustrates the output timings of the output current Iout1 of the first phase comparator 22 of when the complementing circuit 50 is provided, output current Iout 2 of the second phase comparator 32, and resultant output current Iout. As shown in FIG. 12, when missing of one of the reference signal fs has occurred, the complementing circuit 50 generates a complementing signal at a timing ((1/fso) +α) that lags behind the original period (1/fso) of the reference signal but that lies in the blind region of the first phase comparator 22, and outputs it to the first phase comparator 22. When the complementing signal is not generated, there is produced no current (shown by a broken line of FIG. 12) that should be output from the first phase comparator circuit 22. In this embodiment, no complementing signal is fed to the second phase comparator 32, and the reference signals fs one of which is missing are input. Here, however, since the switching circuit 325 (see FIG. 5) of the second phase comparator 32 remains off, the current Iout2 is not output from the second phase comparator 32. Therefore, no resultant output current Iout is output for the period in which one signal has been missing, and the PLL circuit is prevented from erroneously operating.

The PLL circuit according to a fourth embodiment of the present invention will be described below with reference to FIGS. 13 to 16.

This PLL circuit is the same as the PLL circuit of the above-mentioned third embodiment but in which a noise detecting/removing circuit 60 is provided before the complementing circuit 50 and the second phase comparator 32 in order to detect and remove noise superposed on the reference signals fs, so that the reference signals fs without noise are input to the first phase comparator 22 and to the second phase comparator 32. In the other respects, this PLL circuit is the same as that of the above-mentioned third embodiment. Therefore, the same reference numerals are used but the description will not be repeated.

Figure 14:
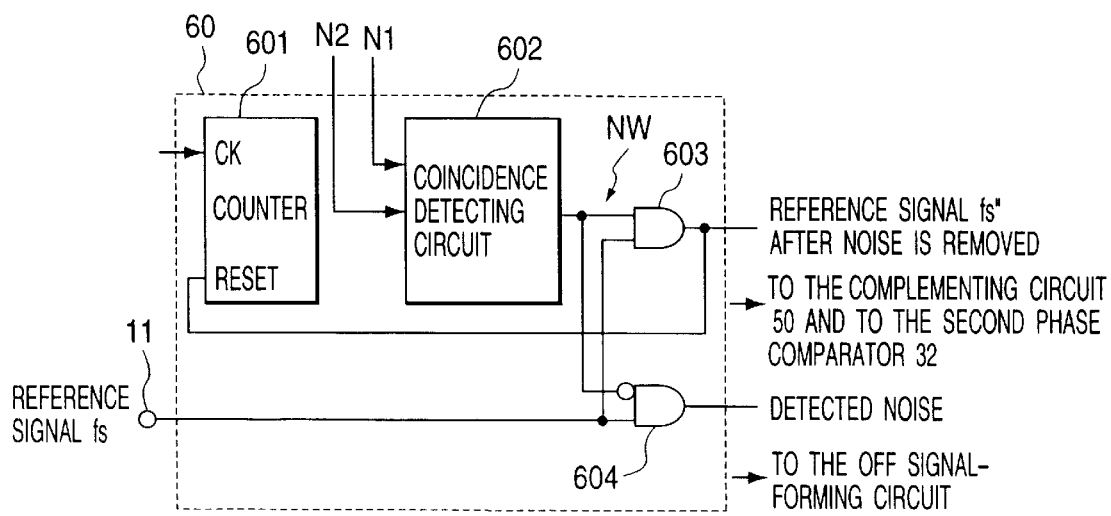
FIG. 14 is a block diagram illustrating a noise detecting/removing circuit of the PLL circuit.
Figure 15:
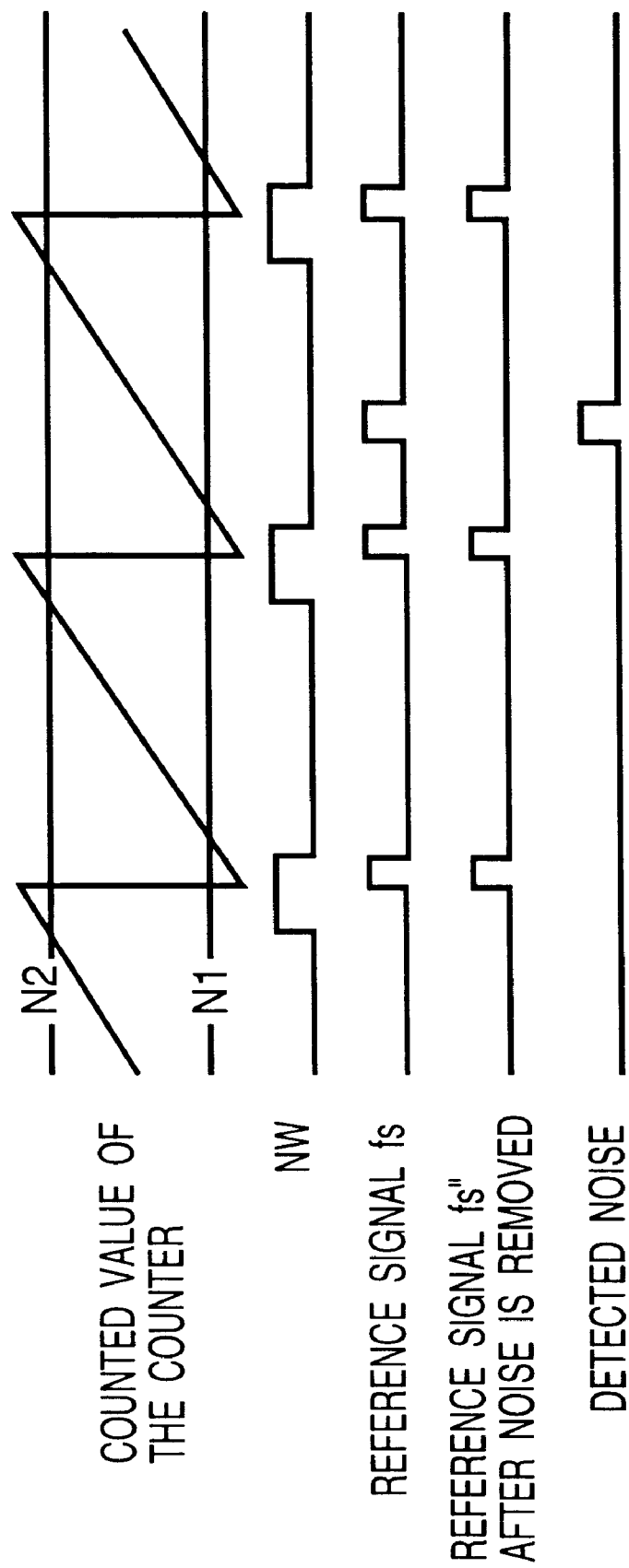
FIG. 15 is a timing chart illustrating the operation timings of the noise detecting/removing circuit.

FIGS. 14 and 15 illustrate an example of the noise detecting/removing circuit 60 and its operation timings. The noise detecting/removing circuit 60 includes a counter 601 for counting the number of clock signals CK that serve as a reference having a frequency much higher than that of the reference signals fs, and a coincidence detecting circuit 602 which detects that the counted value of the counter 601 comes in agreement with two predetermined values N1, N2 (N1<N2, which have been set in advance) having a time width spanning before and after a value that corresponds to the original period of the reference signal fs, and outputs a coincidence signal NW for a period of time from when the counted value is N2 up to when it is N1 including the time at which the value is reset to zero.

The coincidence signal NW of the coincidence detecting circuit 602 is input to an AND gate 603 that receives the reference signals fs through its one terminal. Therefore, the reference signal fs that is input between the counted values N2 and N1 (i.e., near the timing that corresponds to the original period of the reference signal fs) of the counter 601, is not noise, but is a normal signal that is output from the AND gate 603. Thus, there are obtained reference signals fs" from which noise is removed. The reference signals fs" from which noise is removed are input to the second phase comparator 32 and to the complementing circuit 50; i.e., the complemented reference signals fs" are fed to the first phase comparator 22.

A reset terminal of the counter 601 receives reference signals fs" from which noise is removed and which are output from the AND gate 603.

The coincidence signal NW output from the coincidence detecting circuit 602 is inverted and is input, as a noise detection/removal signal, to one terminal of an AND gate 604. The other input to the AND gate 604 is the reference signal fs. Therefore, the reference signal fs that is input when the noise detection/removal signal is at a high level, is output from the AND gate 604 as a detected noise signal. The detected noise signal is sent to an off signal-forming circuit not shown. The off signal-forming circuit forms a control signal (phase comparator turn-off signal) that halts the operations of the first and second phase comparators 22, 32 for only a predetermined period of time. Therefore, the operations of the phase comparators 22 and 32 are halted. The reason why after noise is detected, the operations of the first and second phase comparators 22, 32 are halted for only a predetermined period of time is that noise that is once superposed on the reference signal fs, may be superposed successively.

Figure 16:
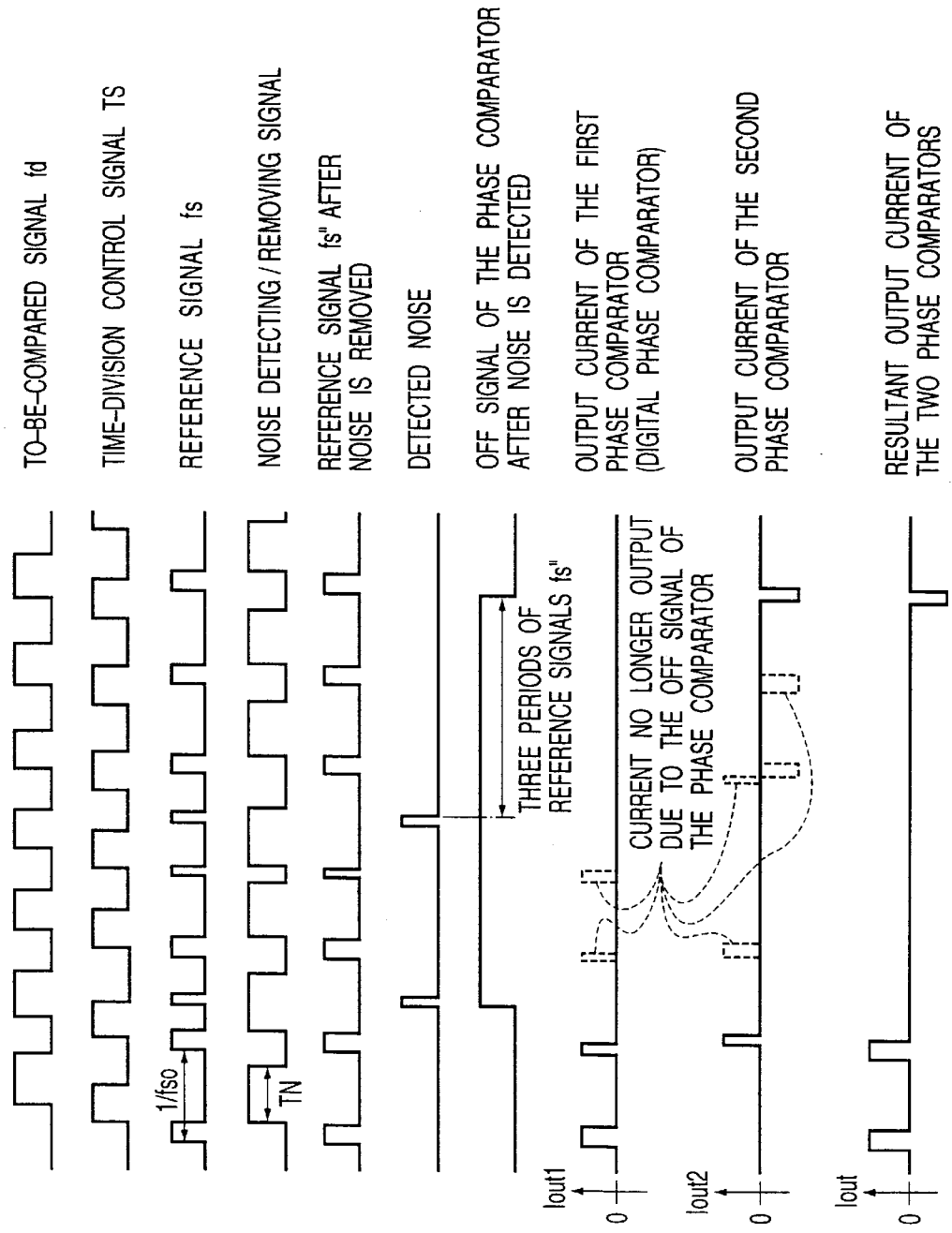
FIG. 16 is a timing chart illustrating the operation timings of the PLL circuit of the fourth embodiment.

FIG. 16 shows the output timings of the output current Iout1 of the first phase comparator 22 of when the noise detecting/removing circuit 60 is provided, output current Iout2 of the second phase comparator 32, and resultant output current Iout. As shown, when the reference signal fs is input within a period of time (time width TN in which the noise detection/removal signal is at the high level) which is shorter than the original period (1/fso) of the reference signal fs, the noise detecting/removing circuit 60 detects the reference signal fs as noise and does not output it. In response to the noise that is detected, furthermore, the off signal-forming circuit forms a phase comparator turn-off signal for halting the operations of the first and second phase comparators 22, 32 for only a predetermined period of time. There is no particular limitation in the period for which the operations of the phase comparators 22 and 32 are halted. In FIG. 16, however, the halting period is equal to three periods of the reference signals fs".

In FIG. 16, the circuit starts counting three periods of the reference signals fs" in response to a noise-detection signal of the left side. After the reference signals of two periods are counted, new noise is input (noise-detection signal of the right side). In response to the new noise, therefore, the circuit starts counting three periods of the reference signals fs" again. During a total of five periods of the reference signals fs", there is produced no current (shown by a broken line in FIG. 16) that should be produced from the first and second phase comparator circuits 22 and 32. Therefore, noise that is superposed on the reference signal fs is removed, the operations of the phase comparators 22 and 32 are halted after the noise is detected, the resultant output current Iout is not erroneously output, and the PLL circuit is prevented from erroneously operating.

The PLL circuit of a fifth embodiment according to the present invention will now be described below with reference to FIGS. 17 to 22. The same portions as those of the above-mentioned first embodiment are denoted by the same reference numerals and their description will not be repeated.

Figure 17:
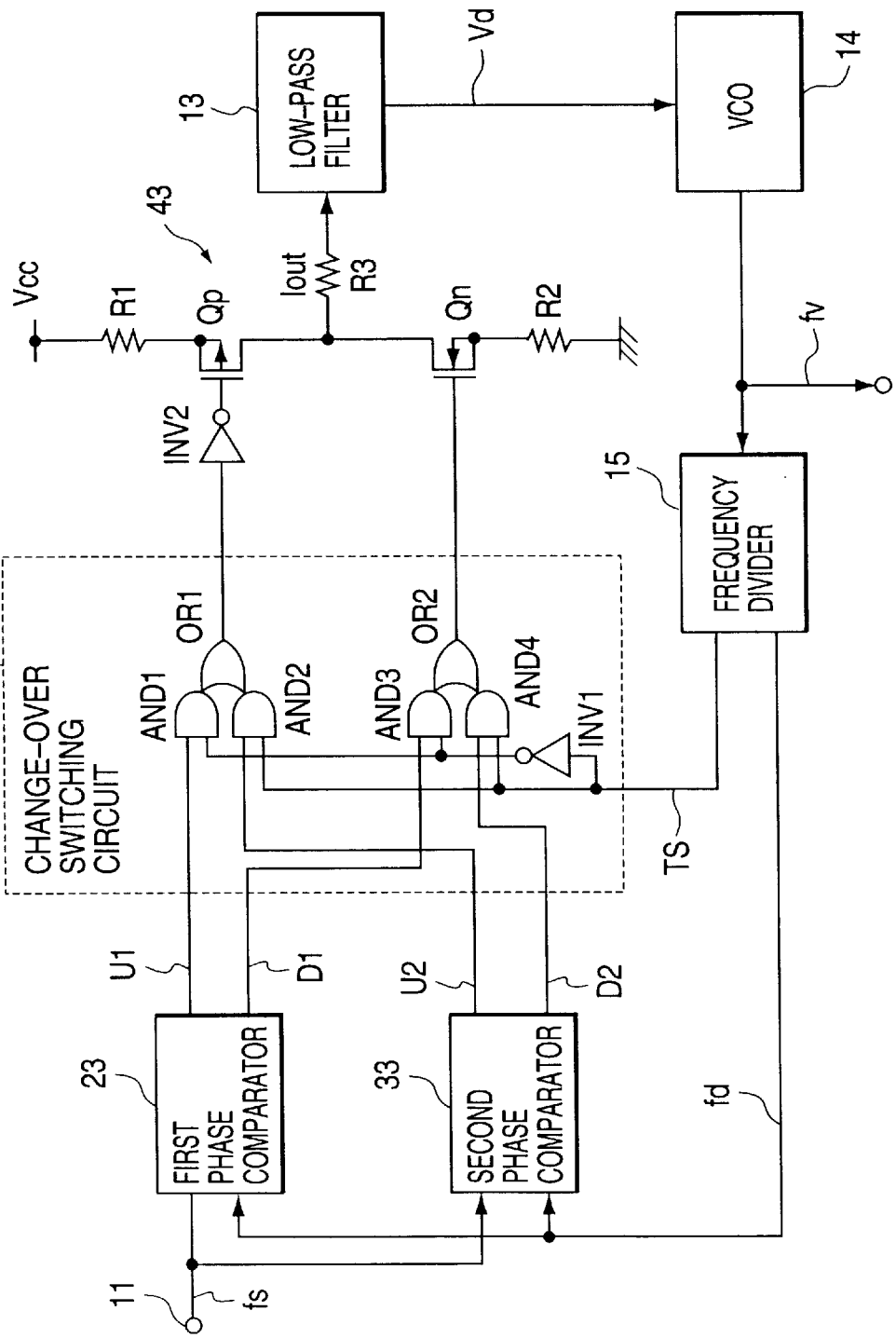
FIG. 17 is a block diagram illustrating the constitution of the PLL circuit of a fifth embodiment according to the present invention.

In this PLL circuit as shown in FIG. 17, phase error signals obtained from the up output U1 and down output D1 of the first phase comparator 23 of digital type and phase error signals obtained from the up output U2 and down output D2 of the second phase comparator 33 of sampling type (hereinafter referred to as phase error signals U1, D1, U2, D2 in the fifth embodiment) are suitably changed over by a change-over switching circuit 42, and any one phase error signal only is input to a CMOS inverter circuit 43, so that the CMOS inverter circuit 43 produces a current (error current) Iout based upon the error signal. Moreover, the change-over switching circuit 42 performs the change-over operation in response to the time-division control signals TS sent from the frequency divider 15.

The first phase comparator 23 is, for example, the same as the phase comparator 22 shown in FIG. 2 but in which the pair of current sources 220, 225 and the pair of switching circuits 221, 226 are not provided. Phases of the reference signals fs and of the to-be-compared signals fd are compared, and phase error signals U1, D1 are directly output to the change-over switching circuit 42. The phase error signal U1 is output when the phase of the to-be-compared signal fd is delayed behind the reference signal fs, and the phase error signal D1 is output when the phase of the to-be-compared signal fd is advancing ahead of the reference signal fs.

The second phase comparator 33 compares the phases of the reference signals fs and of the to-be-compared signals fd, samples the phase error signals U2, D2 only during a period in which the reference signal fs is at the high level, directly outputs the phase error signal U2 to the change-over switching circuit 42 when the to-be-compared signal fd is at the low level, and directly outputs the phase error signal D2 to the change-over switching circuit 42 when the to-be-compared signal fd is at the high level.

The change-over switching circuit 42 is constituted by a first inverter circuit INV1 for inverting the time-division control signals TS output from the frequency divider 15, a first AND circuit AND1 for receiving the phase error signal U1 output from the first phase comparator 23 and signals which are inverted time-division control signals TS inverted by the inverter circuit INV1, a second AND circuit AND2 for receiving the phase error signal U2 output from the second phase comparator 33 and the time-division control signals TS, a third AND circuit AND3 for receiving the phase error signal D1 output from the first phase comparator 23 and signals which are inverted time-division control signals TS, a fourth AND circuit AND4 for receiving a phase error signal D2 output from the second phase comparator 33 and the time-division control signals TS, a first OR circuit OR1 for receiving the signals output from the first AND circuit AND1 and the second AND circuit AND2, and a second OR circuit OR2 for receiving the signals output from the third AND circuit AND3 and the fourth AND circuit AND4.

The output signal of the first OR circuit OR1 is inverted by the second inverter circuit INV2 and is input to the gate of a PMOSFET (p-type insulated gate field-effect transistor) Qp which constitutes the CMOS inverter circuit 43. The output signal of the second OR circuit OR2 is input to the gate of an NMOSFET (n-type insulated gate field-effect transistor) Qn which constitutes the CMOS inverter circuit 43.

In the CMOS inverter circuit 43, either the PMOSFET Qp or the NMOSFET Qn is turned on by an output signal (error signal) of the change-over switching circuit 42, and acts as a current source for flowing an error current Iout. While the PMOSFET Qp is on, a positive (+) error current Iout flows from a positive power-source voltage line Vcc to the low-pass filter 13 through a resistor R1, the PMOSFET Qp and a resistor R3. While the NMOSFET Qn is on, contrastively, a negative (−) error current Iout flows from the low-pass filter 13 to a grounding point through the resistor R3, the NMOSFET Qn and a resistor R2.

The low-pass filter 13 removes high-frequency components from the error current Iout to generate an error signal voltage Vd, and outputs it to the voltage-controlled oscillator 14.

The voltage-controlled oscillator 14 receives the error signal voltage Vd, adjusts its own oscillation frequency, and outputs signals fv to the frequency divider 15 and to an output terminal 16.

Figure 18:
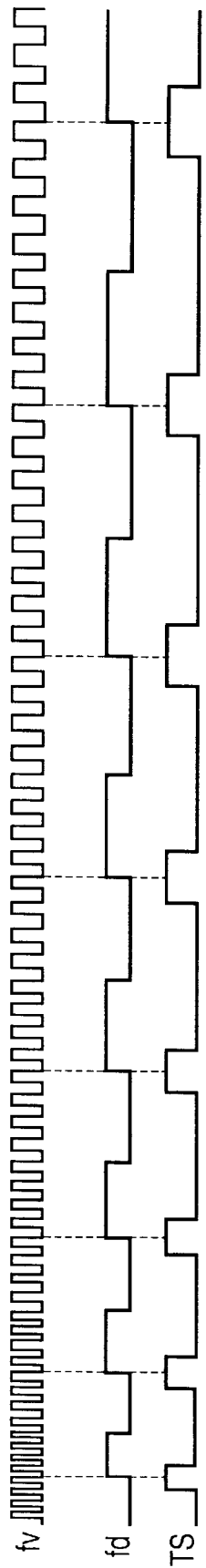
FIG. 18 is a timing chart illustrating the timings of oscillation output signals fv, to-be-compared signals fd and time-division control signals TS of the VCO of the PLL circuit.

The frequency divider 15 divides the frequency of the output signals fv of the voltage-controlled oscillator 14 to obtain to-be-controlled signals fd, forms time-division control signals TS and outputs them to the change-over switching circuit 42. That is, the to-be-compared signals fd and time-division control signals TS are obtained by dividing the frequency of the output signals fv of the voltage-controlled oscillator 14. As shown in FIG. 18, therefore, the frequencies of the to-be-compared signals fd and of the time-division control signals TS change with a change in the frequency of the output signals fv of the voltage-controlled oscillator 14. In this embodiment, though there is no particular limitation, the frequency divider 15 divides the frequency of output signals fv of the voltage-controlled oscillator 14 into one-eighth (⅛).

Figure 19:
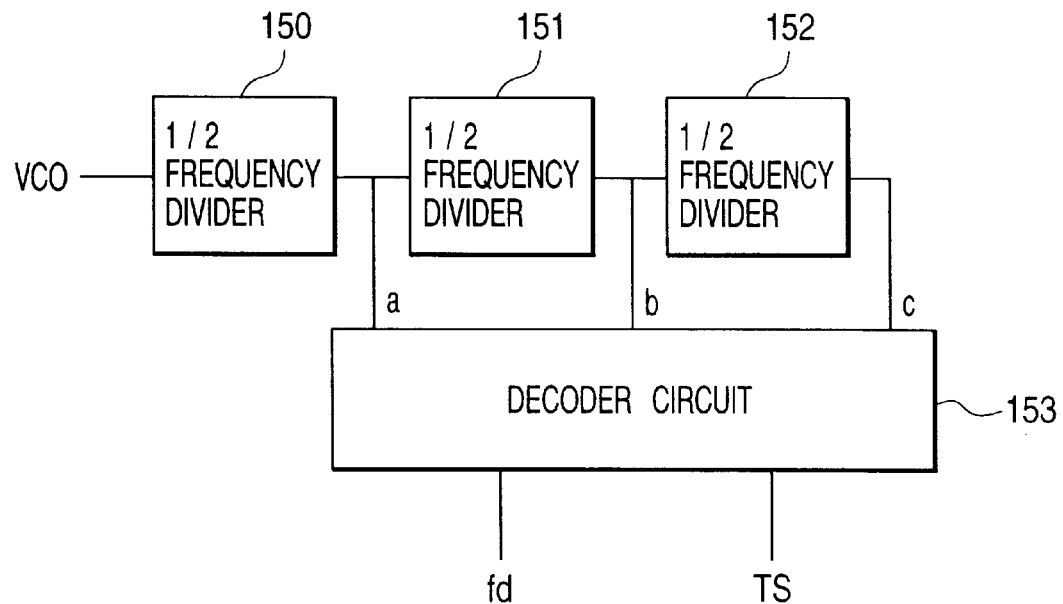
FIG. 19 is a block diagram illustrating an embodiment of a one-eighth frequency divider in the PLL circuit.

FIG. 19 schematically illustrates an example of the frequency divider 15. The frequency divider 15 is constituted by, for example, three ½ frequency dividers 150, 151 and 152 that divide the frequency of input signals into one-half (½) and are connected in series, and a decoder circuit 153 that receives output signals (frequency-divided signals) a, b and c from the ½ frequency dividers 150, 151, 152 and generates to-be-compared signals fd and time-division control signals TS from these input signals a, b and c. The output signal a of the first ½ frequency divider 150 is obtained by dividing the frequency of the output signal fv of the voltage-controlled oscillator 14 into one-half, the output signal b of the second ½ frequency divider 151 is obtained by dividing the frequency of the signal fv into one-fourth, and the output signal c of the third ½ frequency divider 152 are obtained by dividing the frequency of the signal fv into one-eighth.

Figure 20:
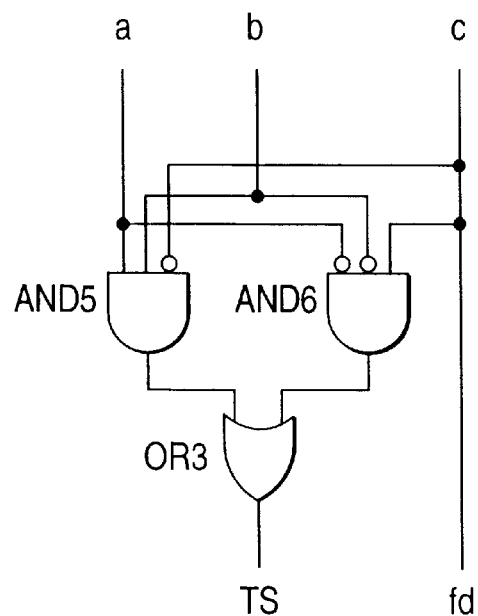
FIG. 20 is a diagram of a logic circuit illustrating an embodiment of a decoder of the one-eighth frequency divider.
Figure 21:
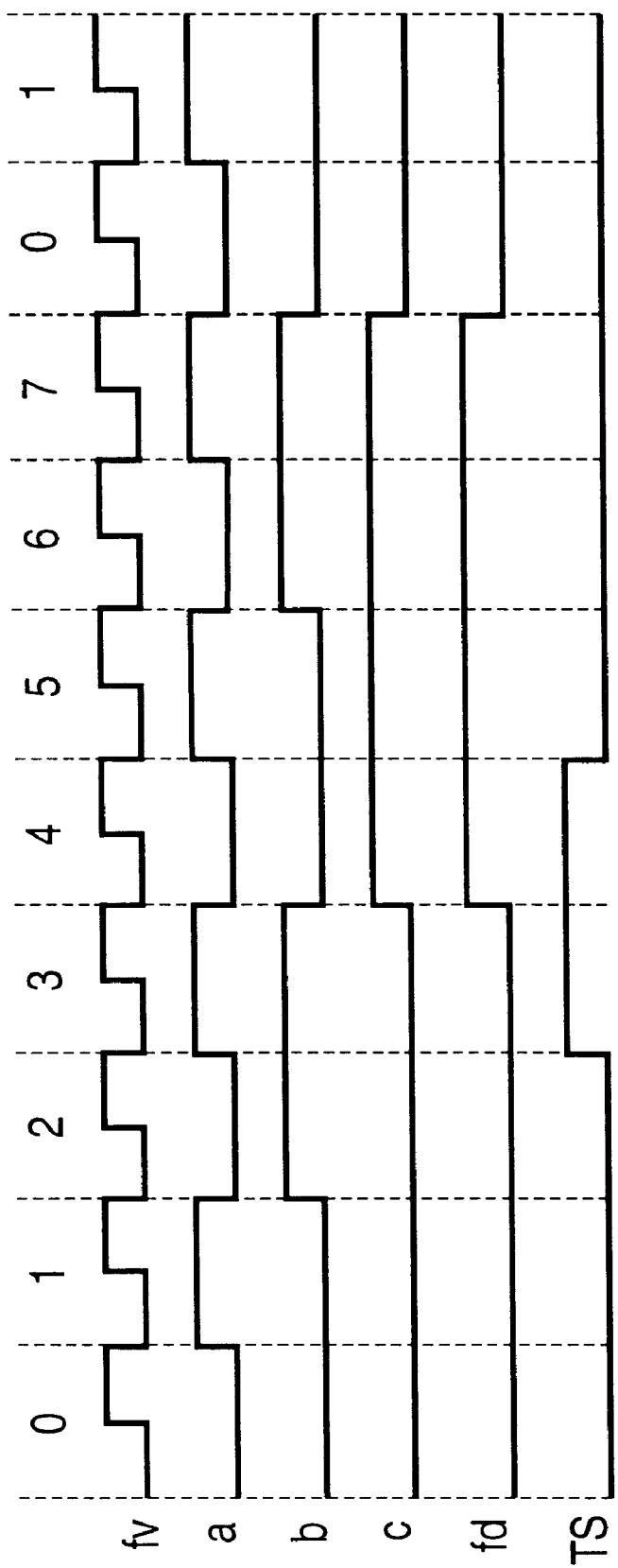
FIG. 21 is a timing chart illustrating the timings of input/output signals of the decoder.

As shown in FIG. 20, the decoder circuit 153 is constituted by, for example, two AND circuits AND5 and AND6 that receive frequency-divided signals a, b and c output from the above-mentioned three ½ frequency dividers 150, 151 and 152 or inverted signals thereof, and an OR circuit OR3 that receive signals output from these two AND circuits AND5 and AND6. The fifth AND circuit AND5 receives the ½ frequency-divided signal a, the ¼ frequency-divided signal b and the ⅛ frequency-divided signals c from the frequency dividers 150, 151 and 152. The input terminal for receiving the ⅛ frequency-divided signal c of the fifth AND circuit AND5 is effective while the level is low. The sixth AND circuit AND6 receives the ½ frequency-divided signal a, the ¼ frequency-divided signal b and the ⅛ frequency-divided signal c from the frequency dividers 150, 151 and 152. The input terminals for receiving the ½ frequency-divided signal a and the ¼ frequency-divided signal b of the sixth AND circuit AND6 is effective while the level is low. The third OR circuit OR3 outputs time-division control signals TS. As shown in FIG. 21, therefore, the time-division control signal TS is at the high level while the ½ frequency-divided signal a, ¼ frequency-divided signal b and ⅛ frequency-divided signal c are at the high level, high level and low level, or at the low level, low level and high level, respectively. In other cases, the time-division control signal TS is at the low level. The ⅛ frequency-divided signal c are continuously output as to-be-compared signals fd.

Figure 22:
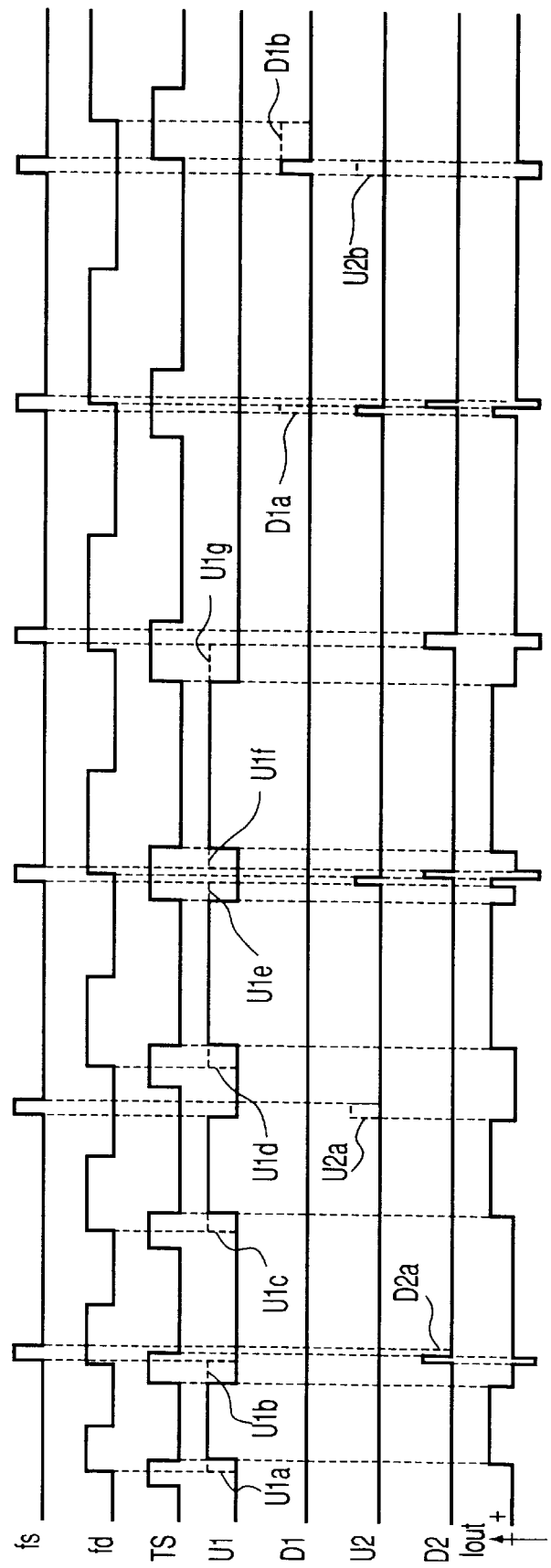
FIG. 22 is a timing chart illustrating the operation timings of the PLL circuit of a fifth embodiment.

FIG. 22 shows the output timings of the phase error signals U1, D1 of the first phase comparator 23, the output timings of the phase error signals U2, D2 of the second phase comparator 33, and the output timings of the error current Iout. When the time-division signal TS is at the low level, as shown, an error current Iout flows based upon the phase error signals U1, D1 output from the first phase comparator 23. When the time-division control signal TS is at the high level or near the lock phase of the to-be-compared signal fd (in the blind region of the first phase comparator 23), an error current Iout flows based upon the phase error signals U2, D2 of the second phase comparator 33.

For the fifth embodiment, therefore, the first phase comparator 23 controls the phase in a state that the phase is greatly deviated from the frequency control, and the second phase comparator 33 controls the phase in a state that the phase is deviated little. Accordingly, the PLL circuit as a whole has no blind region, whereby the voltage-controlled oscillator 14 stably operates to improve the stability of the oscillation frequency of the oscillation output signals fv.

In FIG. 22 showing the waveforms of the phase error signals U1, D1, U2 and D2, the first phase comparator 23 and the second phase comparator 33 are time-divisionally operated based upon the time-division control signals TS. Therefore, the signals U1a, U1b, U1c, U1d, U1e, U1f, U1g, D1a, D1b, U1a, U2b and D2a, that do not contribute to the output of the error current Iout, are shown by broken lines.

Figure 23:
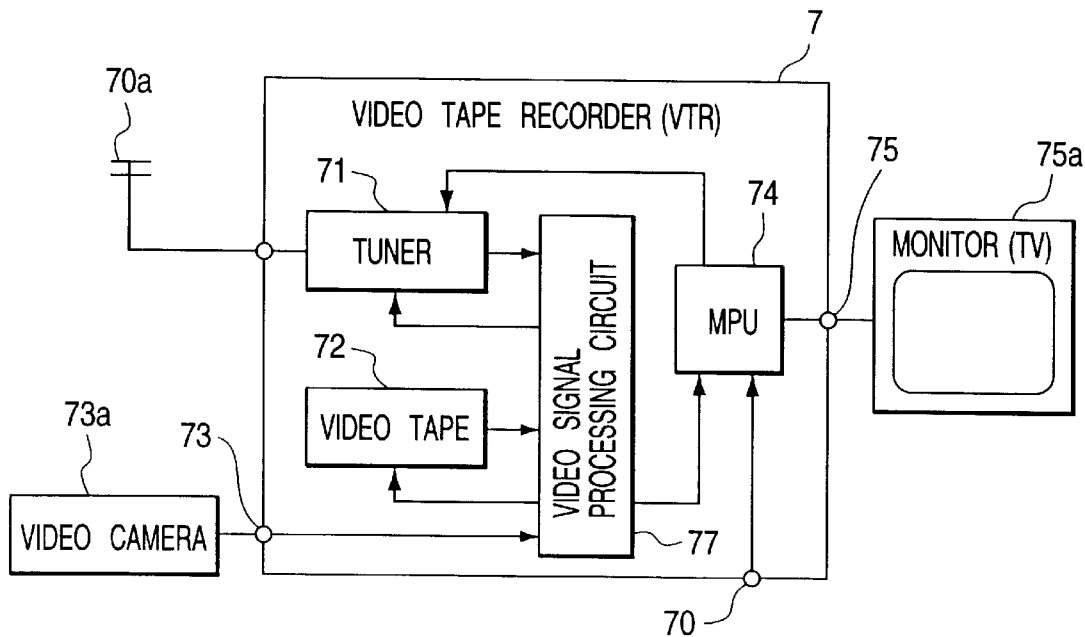
FIG. 23 is a block diagram illustrating the constitution of a VTR to which the PLL circuit of the present invention is applied.

FIG. 23 illustrates an example in which the PLL circuit of the present invention is adapted to a VTR. In this VTR 7, video signals detected and selected through a tuner 71 from radio waves received by an antenna 70a, video signals reproduced from a video tape 72, or video signals input from an external video camera 73a through an external video signal input terminal 73 are fed to a microcomputer (MPU) 74 through a so-called video signal processing circuit 77.

The MPU 74 subjects the input video signals to the AD conversion and operates them, so that an image is reproduced or a background of a predetermined color (e.g., blue) is displayed on a monitor (TV) 75a connected to an output terminal 75, or character data can be added to the image or to the background. Furthermore, the MPU 74 outputs a control signal to the tuner 71 and to a motor which is a means for driving the video tape 72 to thereby control their operation. The control processing is executed, for example, according to a control instruction sent from a remote control device (not shown) attached to the VTR 7 to the MPU 74 through an external control instruction input terminal 70.

The PLL circuit according to the present invention is contained in the MPU 74 and is used for generating clock signals for controlling the character display positions.

Figure 24:
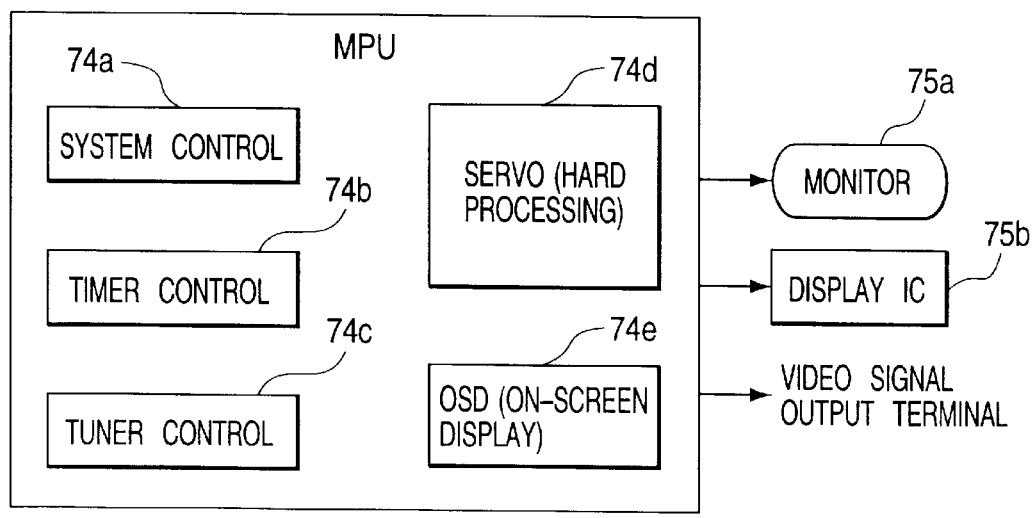
FIG. 24 is a block diagram illustrating the functions of an MPU of the VTR.

FIG. 24 is a diagram illustrating the functions of the MPU 74. As shown in FIG. 24, the MPU 74 is equipped with a system control 74a for controlling playback, special playback such as slow playback, recording, fast forwarding and rewinding of the VTR 7, a timer control 74b for controlling the timekeeping function at the time of timer-recording of the VTR 7 (recording a program by programing), a tuner control 74c for controlling the tuner function in selecting a station, a servo function 74d for servo-controlling various motors 75c for loading or ejecting the video tape 72 or for feeding the tape, and an OSD (on-screen display) function 74e for controlling the character display positions at the time of adding character data to the video signals. The MPU 74 outputs video signals to a monitor 75a, to an integrated circuit (display IC) 75b for display, and to a video signal output terminal.

Figure 25:
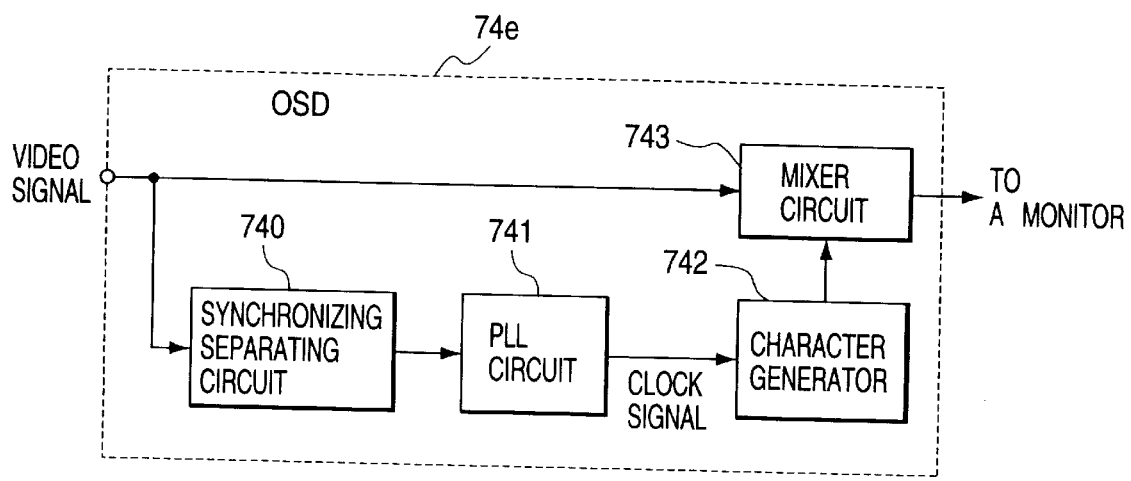
FIG. 25 is a block diagram illustrating an embodiment of an OSD of the MPU.
Figure 26:
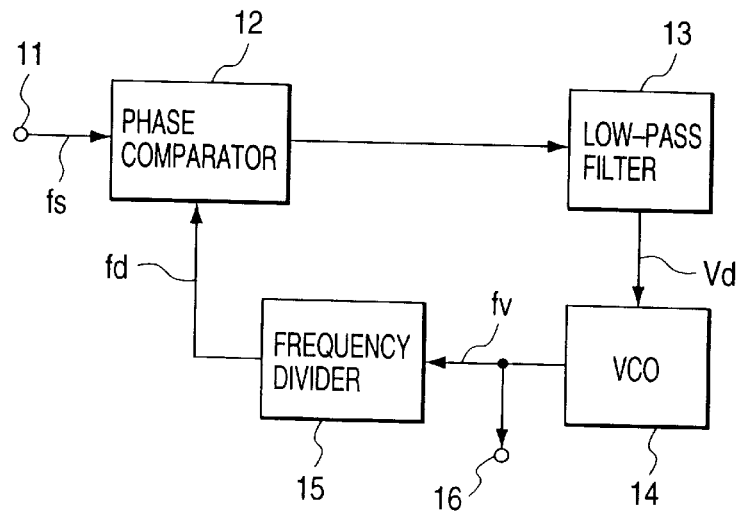
FIG. 26 is a block diagram illustrating the constitution of a conventional PLL circuit.
Figure 27:
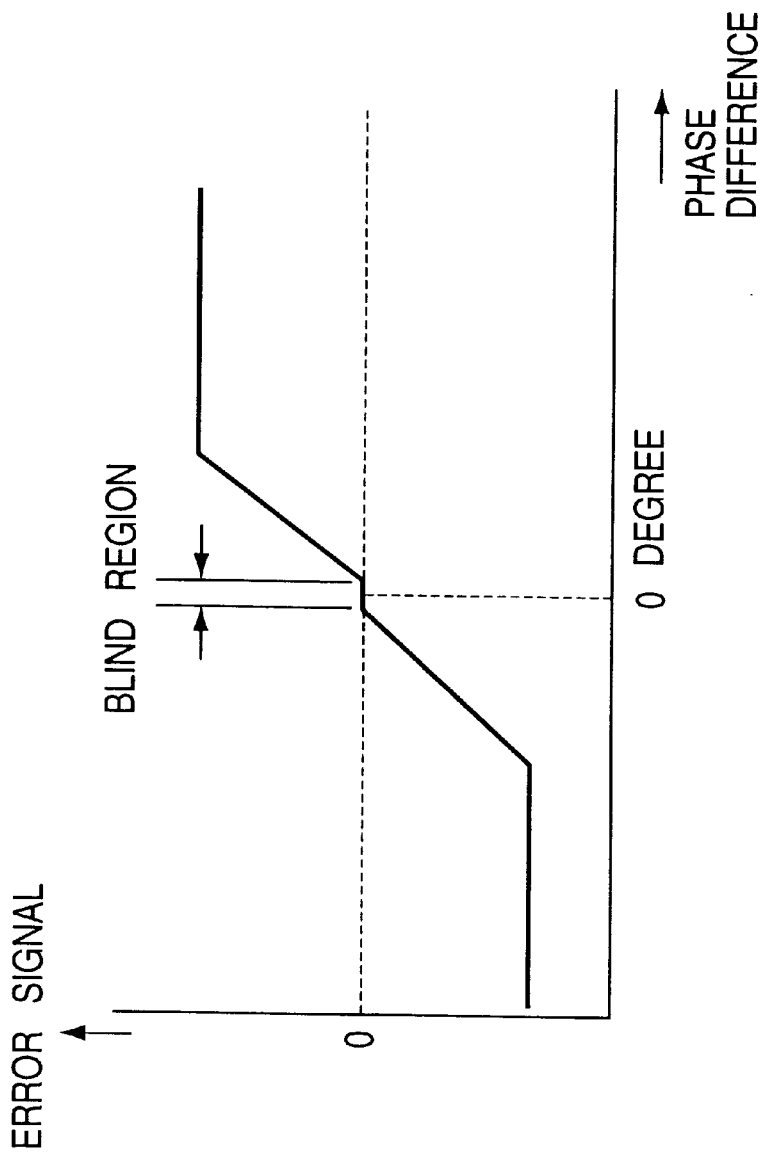
FIG. 27 is a diagram of static characteristics of phase comparison, illustrating the output characteristics of phase error signals of the conventional PLL circuit.
Figure 28:
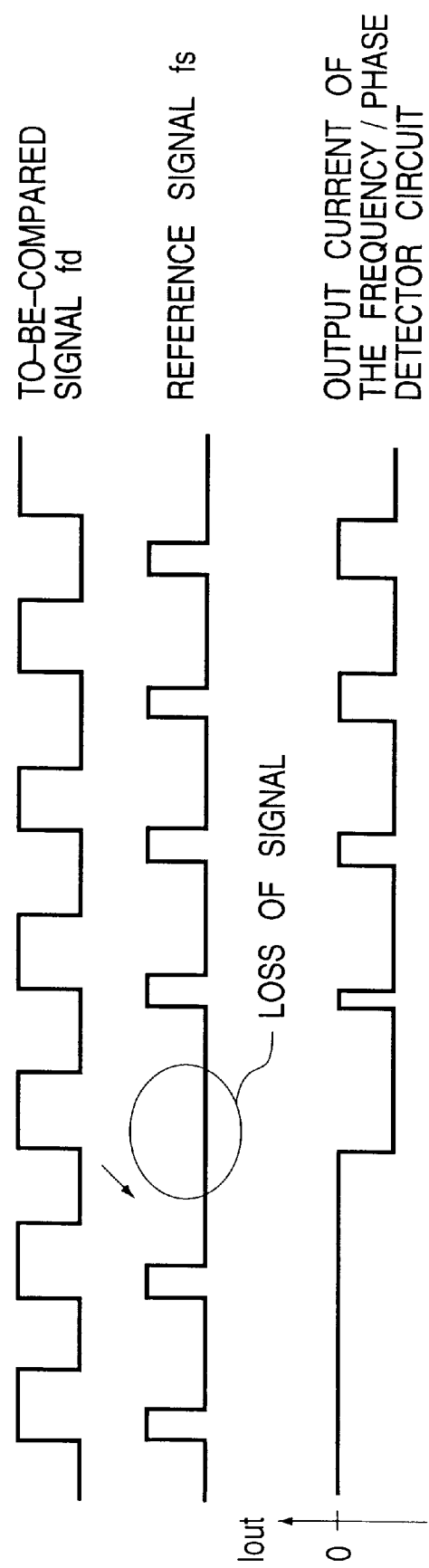
FIG. 28 is a timing chart of when a signal is missing in the conventional PLL circuit.

FIG. 25 illustrates an embodiment of the OSD 74e. The video signals input to the OSD 74e are branched and are sent to a synchronized separating circuit 740 and to a mixing circuit 743. The synchronized separating circuit 740 separates synchronizing signals from the video signals that are input, and sends them to a PLL circuit 741 to which the present invention is adapted. Upon receiving the synchronizing signals as reference signals fs, the PLL circuit 741 generates clock signals for controlling the character display positions and outputs them to a character generator 742. In response to clock signals sent from the PLL circuit 741, the character generator 742 sends character data to a mixing circuit 743. The mixing circuit adds the character data sent from the character generator 742 and the video signals together, and sends them to the monitor or the like.

In the above-mentioned first to fourth embodiments (FIGS. 1, 8, 9 and 13), there are provided parallel a first phase comparator 22 of digital type for detecting the time deviation between the pulse edges of the corresponding phases of a reference signal fs and of a to-be-compared signal fd, and a second phase comparator 32 of sampling type which effects the sampling in a predetermined period of time from a positive pulse edge to a negative pulse edge of a predetermined phase of the reference signal fs. Near the lock phase, an output current Iout2 based on a phase error signal is input from the second phase comparator 32 to the voltage-controlled oscillator 14 through the change-over switch 40. In other phases, an output current Iout1 based on the phase error signal is input from the first phase comparator 22 to the voltage-controlled oscillator 14. Near the lock phase in which the operation of the first phase comparator 22 is in the blind region, therefore, the output current Iout2 is input to the voltage-controlled oscillator 14 from the second phase comparator 32, contributing to improving the stability of the oscillation output signals fv of the voltage-controlled oscillator 14.

In the above-mentioned fifth embodiment (FIG. 17), there are provided parallel a first phase comparator 23 of digital type for detecting the time deviation between the pulse edges of the corresponding phases of a reference signal fs and of a to-be-compared signal fd, and a second phase comparator 33 of sampling type which effects the sampling in a predetermined period of time from a positive pulse edge to a negative pulse edge of a predetermined phase of the reference signal fs. Near the lock phase, either of phase error signals U2, D2 is input from the second phase comparator 33 to the voltage-controlled oscillator 14 through the change-over switch 40. In other phases, either of phase error signal U1, D1 is input from the first phase comparator 23 to the voltage-controlled oscillator 14. Near the lock phase in which the operation of the first phase comparator 23 is in the blind region, therefore, the phase error signals U2 and D2 are input to the voltage-controlled oscillator 14 from the second phase comparator 33, contributing to improving the stability of the oscillation output signals fv of the voltage-controlled oscillator 14.

In the third and fourth embodiments (FIGS. 9 and 13), when one of the reference signals fs is missing, the complementing circuit 50 complements a pulse only to the reference signal fs that are input to the first phase comparator 22. Therefore, the first phase comparator 22 is prevented from erroneously operating, and the PLL circuit has an enhanced stability and reliability.

In the fourth embodiment (FIG. 13), furthermore, the noise detecting/removing circuit 60 detects noise contained in the reference signal fs, removes it therefrom, and permits the signal to be fed to the first phase comparator 22 and to the second phase comparator 32, and further halts the operations of the first phase comparator 22 and the second phase comparator 32 for only a predetermined period of time after the noise is detected. Therefore, the phase comparators 22 and 32 are prevented from erroneously operating, and the PLL circuit has an enhanced stability and reliability.

By using the PLL circuit for generating clock signals to control the character display positions that are added to the video signals, therefore, the characters can be clearly displayed on the screen since the PLL circuit stably operates even when noise produced during special playback of the VTR or due to a weak electric field is contained in the horizontal synchronizing signals or even when a signal is missing. By using the PLL circuit for generating clock signals at the time of subjecting the video signals to A/D conversion, furthermore, the A/D converter stably executes the sampling operation.

In the foregoing, the invention made by the present inventors has been described concretely by way of embodiments. It should, however, be noted that the present invention is in no way limited only to the above-mentioned embodiments but can be modified in a variety of other ways without departing from the gist of the invention.

For instance, the first phase comparator 22 is not limited to the one that is constituted as described above, but may be constituted in any way, as long as it is of a digital type.

Besides, the second phase comparator 32 is not limited to the one that is constituted as described above, but may be constituted in any way, as long as it is of a sampling type.

The complementing circuit 50 is not limited to the one that is constituted as described above, but may be constituted in any way, as long as it is capable of complementing the signal missing of a reference signal fs.

The noise detecting/removing circuit 60 is not limited to the one constituted as described above, but may be constituted in any way, as long as it is capable of detecting and removing noise superposed on the reference signals fs.

It needs not be pointed out that the change-over switching circuit 42 is not limited to the one of the fifth embodiment.

Moreover, the VTR 7, MPU 74 and OSD 74e can be designed in a variety of ways.

In the foregoing the invention made by the present inventors has been chiefly described with reference to the case where it is adapted to a circuit for generating clock signals in synchronism with the horizontal synchronizing signals of video signals in a video reproducing device in the technical field that is the background of the invention. The invention, however, is in no way limited thereto only but can also be utilized for PLL circuits in general.

According to the present invention as described above, a quick pull-in response is accomplished and clock signals with decreased jitter are output from the voltage-controlled oscillator of the PLL circuit that generates clock signals in synchronism with the horizontal synchronizing signals of video signals obtained from a broadcast, communication or an image reproducing device such as VTR or the like. By using the PLL circuit for generating clock signals to control the display positions of the characters that are added to the video signals, therefore, the characters can be clearly displayed on the screen since the PLL circuit stably operates even when noise produced during special replay of the VTR or due to a weak electric field is contained in the horizontal synchronizing signals or even when a signal is missing. By using the PLL circuit for generating clock signals at the time of subjecting the video signals to A/D conversion, furthermore, the A/D converter stably executes the sampling operation.

We claim:

1. A phase locked loop circuit formed on a semiconductor chip, comprising:

a first phase comparator which compares phases of a first pulse signal and a second pulse signal and which outputs a first current signal corresponding to a phase difference of the first and the second pulse signals, said second pulse signal having pulse edges;

a second phase comparator which compares the phases of the first pulse signal and the second pulse signal and which outputs a second current signal corresponding to the phase difference of the first and the second pulse signals, said second phase comparator having a first switching circuit which samples a current supplied by the second pulse signal and outputs the sampled current as the second current signal to said switch circuit, the first switching circuit being turned on/off by the first pulse signal;

a voltage-controlled oscillator which outputs a third pulse signal corresponding to the second pulse signal on the basis of the first or second current signal; and a switch circuit which performs a change-over operation by a control signal to supply said voltage-controlled oscillator with the second current signal near each of the pulse edges of the second pulse signal.

2. A phase locked loop circuit formed on a semiconductor chip according to claim 1, wherein the control signal includes a fourth pulse signal which has a first pulse width spanning before and after each of the pulse edges of the second pulse signal.

3. A phase locked loop circuit formed on a semiconductor chip according to claim 2, further comprising:

a filter which is coupled between said voltage-controlled oscillator and said switch circuit, and which decreases high-frequency components in the first and the second current signal, and which outputs a voltage signal corresponding to the first and the second current signal to said voltage-controlled oscillator.

4. A phase locked loop circuit formed on a semiconductor chip according to claim 3, wherein said filter is a low-pass filter.

5. A phase locked loop circuit formed on a semiconductor chip according to claim 3, wherein a frequency of the third pulse signal changes in accordance with a value of the voltage signal.

6. A phase locked loop circuit formed on a semiconductor chip according to claim 5, further comprising:

an output terminal which is coupled to said voltage-controlled oscillator, and which receives the third pulse signal.

7. A phase locked loop circuit formed on a semiconductor chip according to claim 3, further comprising:

a frequency divider which divides the third pulse signal and outputs the second pulse signal to said first and said second phase comparator.

8. A phase locked loop circuit formed on a semiconductor chip according to claim 7, wherein the control signal is generated by said frequency divider.

9. A phase locked loop circuit formed on a semiconductor chip according to claim 7, further comprising:

an input terminal which receives the first pulse signal, and a complementing circuit which provides a complementing signal to said first phase comparator when missing of one of the first pulse signal has occurred, wherein said complementing circuit is coupled between said input terminal and said first phase comparator.

10. A phase locked loop circuit formed on a semiconductor chip according to claim 9, wherein the first pulse signal is supplied to said complementing circuit and said second phase comparator via said input terminal from outside of the semiconductor chip.

11. A phase locked loop circuit formed on a semiconductor chip according to claim 7, further comprising:

a circuit which detects and removes a noise superposed on the first pulse signal, and which is coupled between said input terminal and said complementing circuit.

12. A phase locked loop circuit formed on a semiconductor chip according to claim 1, wherein said switch circuit performs a change-over operation which supplies said voltage-controlled oscillator with the first current signal except near each of the pulse edges of the second pulse signal.

* * * * *